US009959128B2

(12) United States Patent
Bodner et al.

(10) Patent No.: US 9,959,128 B2
(45) Date of Patent: May 1, 2018

(54) DIGITAL SENSOR SYSTEM

(71) Applicant: Infineon Technologies AG, Neubiberg (DE)

(72) Inventors: Christof Bodner, Villach (AT); Theodor Kranz, Sirnitz (AT); Mario Motz, Wernberg (AT); Wolfgang Scherr, Villach Landskron (AT)

(73) Assignee: Infineon Technologies AG, Neubiberg (DE)

( * ) Notice: Subject to any disclaimer, the term of this patent is extended or adjusted under 35 U.S.C. 154(b) by 0 days. days.

(21) Appl. No.: 15/470,267

(22) Filed: Mar. 27, 2017

(65) Prior Publication Data

US 2017/0242709 A1 Aug. 24, 2017

Related U.S. Application Data

(63) Continuation-in-part of application No. 14/926,602, filed on Oct. 29, 2015, now Pat. No. 9,606,603.

(30) Foreign Application Priority Data

Nov. 6, 2014 (DE) ........................ 10 2014 222 651

(51) Int. Cl.
*H03M 1/12* (2006.01)
*G06F 9/44* (2018.01)
*G06F 1/32* (2006.01)
*G06F 13/364* (2006.01)
*G06F 13/42* (2006.01)

(52) U.S. Cl.
CPC .......... *G06F 9/4418* (2013.01); *G06F 1/3287* (2013.01); *G06F 13/364* (2013.01); *G06F 13/4226* (2013.01)

(58) Field of Classification Search
CPC .......... H03M 1/12; G06F 1/3206; G06F 1/06
USPC .................................................. 341/155, 156
See application file for complete search history.

(56) References Cited

U.S. PATENT DOCUMENTS

| 5,426,595 | A | 6/1995 | Picard |
| 9,154,554 | B2 * | 10/2015 | Ananny ............. A63B 24/0062 |
| 9,606,603 | B2 | 3/2017 | Bodner et al. |
| 2003/0164785 | A1 | 9/2003 | Canini et al. |
| 2004/0212678 | A1 | 10/2004 | Cooper et al. |
| 2008/0048285 | A1 | 2/2008 | Schloss et al. |

(Continued)

FOREIGN PATENT DOCUMENTS

| DE | 102004002718 | 11/2004 |
| DE | 102012200213 | 7/2012 |
| GB | 2210537 | 6/1989 |

OTHER PUBLICATIONS

U.S. Appl. No. 14/319,177, Mario Motz et al., "Sensor System Using Multiple Modes for Analog to Digital Conversion," filed Jun. 30, 2014, 31 pages.

*Primary Examiner* — Jean B Jeanglaude
(74) *Attorney, Agent, or Firm* — Harrity & Harrity, LLP

(57) ABSTRACT

A system may include a digital sensor system including a sensor element and a digital interface. The digital interface may provide a wake-up signal based on a sensing action being performed by the sensor element after a predefined event is detected by the digital sensor system. The system may include a microcontroller to receive the wake-up signal provided by the digital interface, and wake from a sleep mode based on receiving the wake-up signal provided by the digital interface.

20 Claims, 20 Drawing Sheets

(56) References Cited

U.S. PATENT DOCUMENTS

| | | |
|---|---|---|
| 2011/0133723 A1 | 6/2011 | Forsyth et al. |
| 2012/0182658 A1 | 7/2012 | Motz |
| 2012/0198258 A1 | 8/2012 | Lye et al. |
| 2013/0094373 A1 | 4/2013 | Reidl et al. |
| 2013/0158686 A1 | 6/2013 | Zhang et al. |
| 2014/0215246 A1 | 7/2014 | Lee et al. |
| 2014/0278205 A1 | 9/2014 | Bhat et al. |

\* cited by examiner

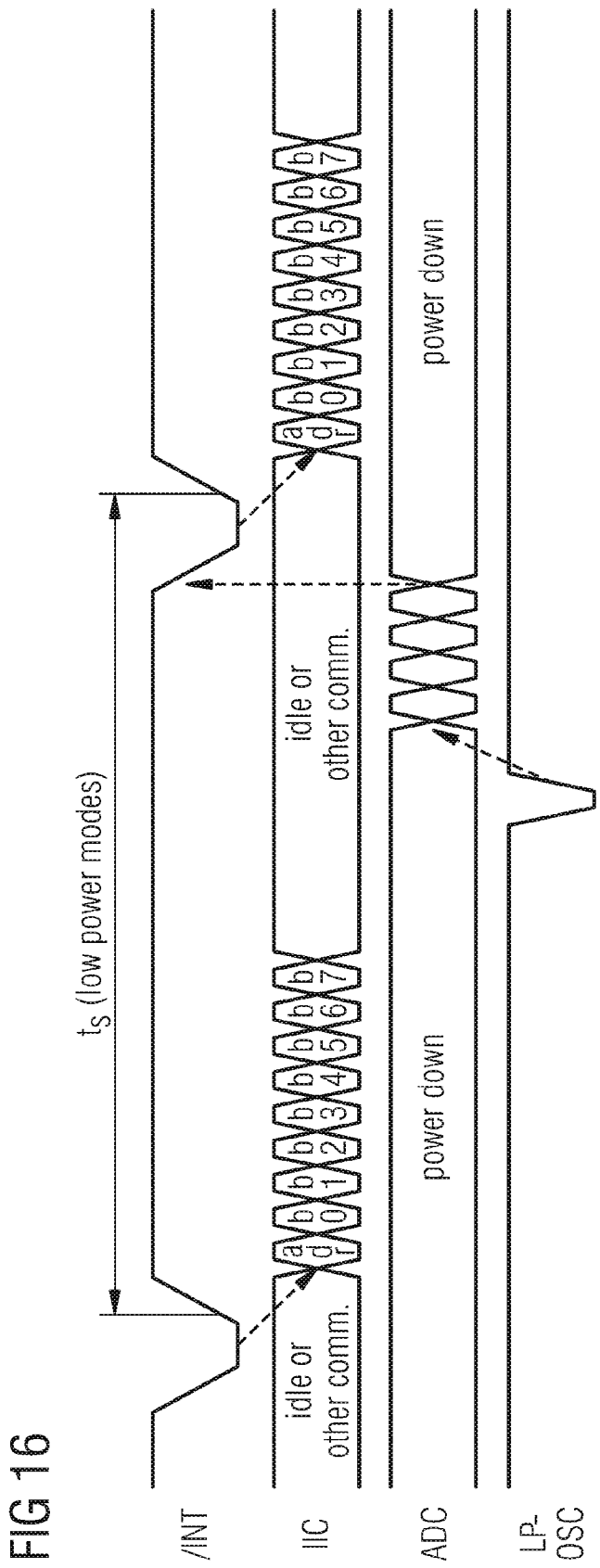

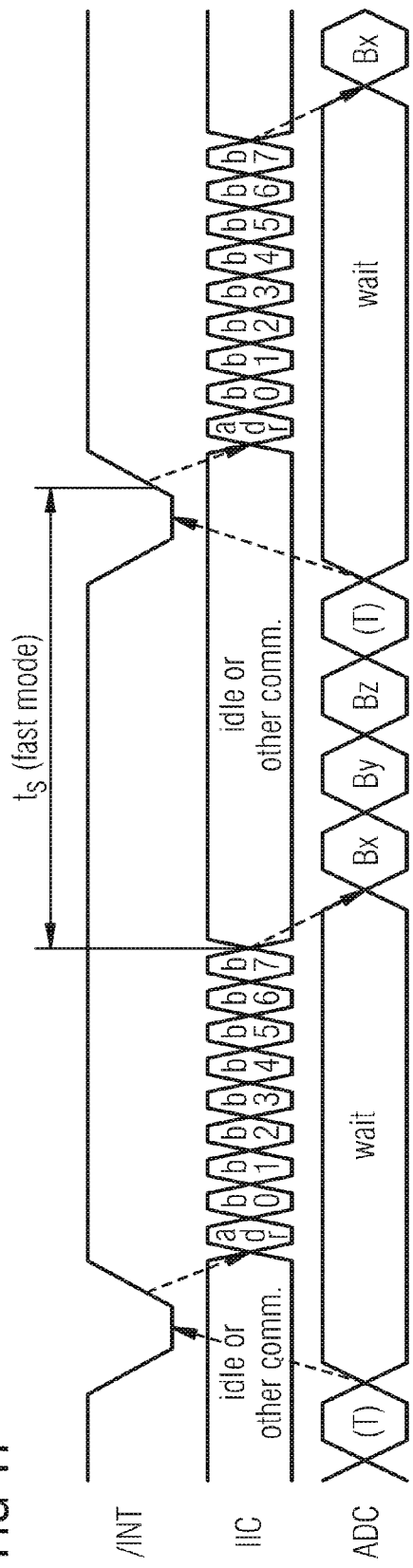

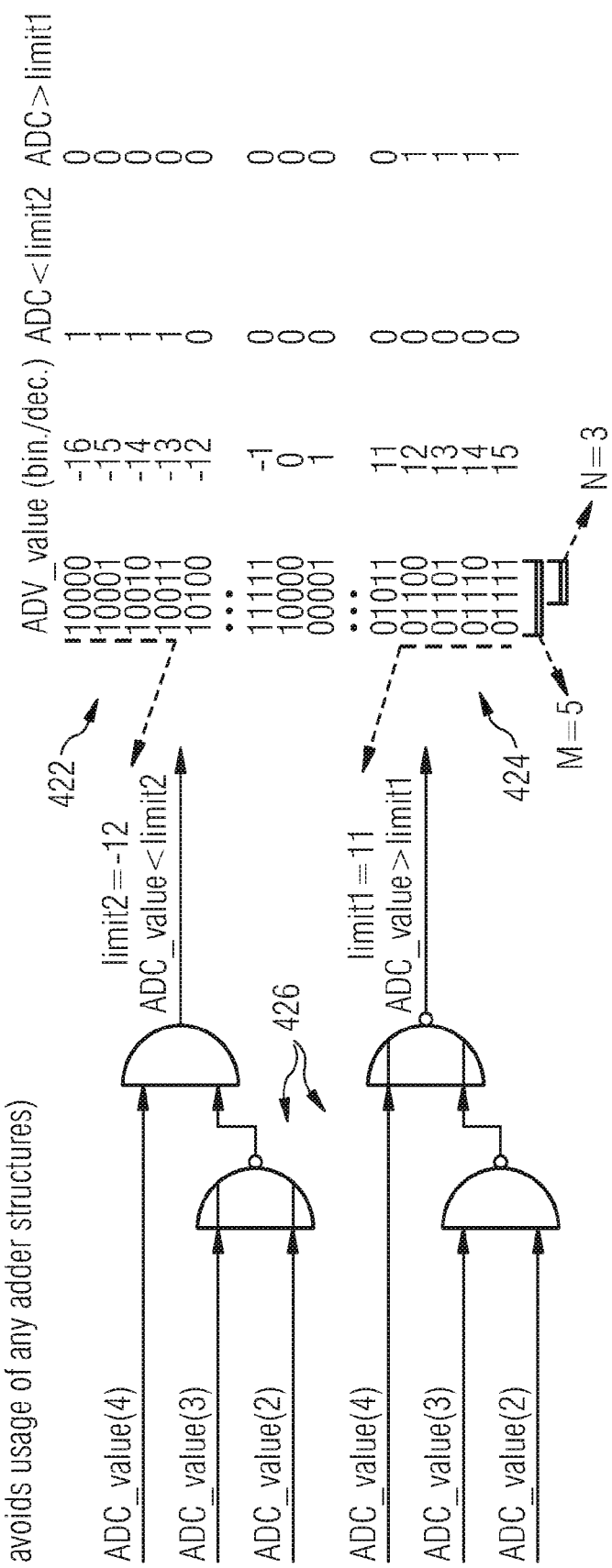

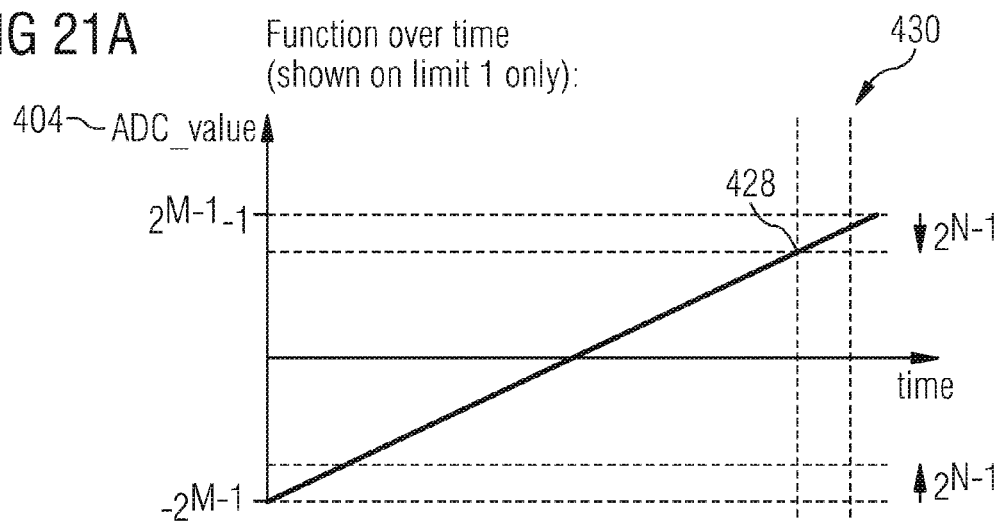

DIGITAL SENSOR SYSTEM

RELATED APPLICATIONS

This application is a continuation-in-part of U.S. patent application Ser. No. 14/926,602 (now U.S. Pat. No. 9,606, 603), filed Oct. 29, 2015, which claims priority under 35 U.S.C. § 119 to German Patent Application No. 102014222651.1, filed on Nov. 6, 2014, the contents of which are incorporated by reference herein in their entirety.

DESCRIPTION

Embodiments of the invention relate to the field of sensors, more specifically to the field of digital sensor systems.

Sensors are used in a variety of fields of which some require low power sensors. Sensors may be used as a detector for a user interaction, for example for detecting the opening/closing of mobile phones/tablets, for controls in cars, for joysticks, etc. Sensors may also be used as anti-tampering detectors, for example in the field of e-metering, etc. Sensors may further be used in position and motion detectors, for example in home appliances, like washing machines, etc.

Several solutions may use non-contact, magnetic solutions due to their durability. The requirements in the above mentioned fields may involve the use of single-dimension sensors (1D sensors) as well as the use of multi-dimension sensors (2D sensors or 3D sensors). In magnetic solutions, the single dimension or multi-dimension sensors may be realized using Hall sensors. Conventionally, such sensors offer only limited functionality, for example only a single switch functionality. However, nowadays additional features need to be offered by a sensor and providing only the single switch functionality is no longer sufficient. For example, linear sensing is desired to cope with inaccuracies of the setup of the sensor system, like inaccuracies of the magnetic setups. Such inaccuracies may result, for example, from the use of low-cost components used in the sensor system. Such inaccuracies are dealt with by using a microcontroller and by implementing specific functions, for example a function that measures a certain signal behavior of a magnetic background field in an e-meter, like a 50 Hz hum, instead of only detecting whether a field with a certain strength is present. Under the same token sensor systems may implement diversity in order to achieve a higher safety level or diagnostic coverage in safety critical applications, such as for example functional safety requirements for automotive vehicles.

SUMMARY OF THE INVENTION

Embodiments of the invention provide a digital sensor system, comprising a sensor element, an analog-to-digital converter coupled to the sensor element, and a wake-up circuit configured to activate the sensor element and the analog-to-digital converter in response to a predefined event.

BRIEF DESCRIPTION OF THE DRAWINGS

For a more complete understanding of the invention, and the advantages thereof, reference is now made to the following description taken in conjunction with the accompanying drawings, in which:

FIGS. 13A and 13B show embodiments for application circuits of the inventive digital sensor system, wherein FIG. 13A shows an embodiment in which the sensor chip and the microcontroller receive different the supply voltages, and FIG. 13B shows an embodiment in which the sensor chip and the microcontroller receive different supply voltages;

FIGS. 15A and 15B show embodiments of application circuits that may be used for IC sensor chips as described in FIG. 14, wherein FIG. 15A shows an implementations using six pins, and FIG. 15B shows an implementations using eight pins;

FIG. 16 shows a conversion scheme in a "low-power mode" of the sensor IC described with regard to FIG. 14;

FIG. 17 shows a conversion scheme when the IC sensor shown in FIG. 14 is operated in a fast mode;

FIG. 20 illustrates an embodiment for an area optimized comparator circuit for fixed limit values, which may be used in the circuit of FIG. 19; and FIGS. 21A-21F illustrate the behaviour of the circuit of FIG. 19 using the area optimized comparator circuit of FIG. 20.

DETAILED DESCRIPTION OF ILLUSTRATIVE EMBODIMENTS

Embodiments of the invention are discussed in detail below, however, it should be appreciated that the invention provides many applicable inventive concepts that can be embodied in a wide variety of specific contexts. The specific embodiments discussed are merely illustrative of specific ways to make and use the invention, and do not limit the scope of the invention. In the following description of embodiments the same or similar elements having the same function have associated therewith the same reference signs, and a description of such elements will not be repeated for every embodiment.

The invention will be described with respect to embodiments in the context of magnetic sensors, for example Hall sensors, however the invention may also be applied to other sensors, like mechanical sensors (for example MEMS pressure sensors, accelerometers and actuators), or environmental sensors (for example temperature sensors, humidity sensors, etc.).

Figure 1:
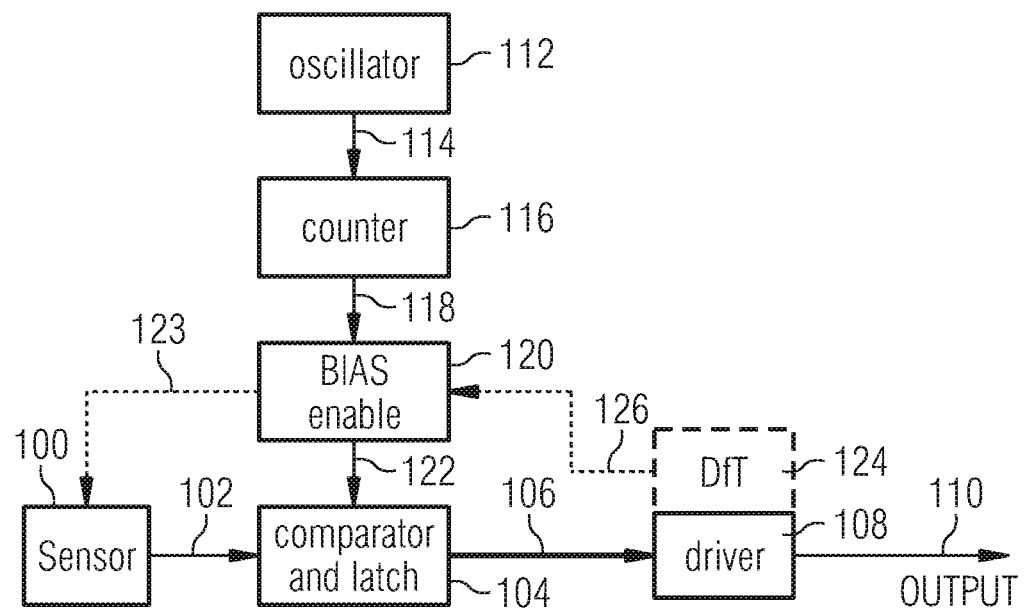
FIG. 1 shows a block diagram of an exemplary analog sensor system implementing a low cost and low power switch solution.

FIG. 1 is a block diagram of an exemplary analog sensor system implementing a low cost and low power switch solution.

The sensor system may comprise a Hall sensor element 100, which, in response to a magnetic field, outputs on line 102 a sensor signal representing the strength of the magnetic field. The analog sensor signal is applied to an analog comparator/latch circuit 104 which compares the sensor signal received via line 102 to a reference value. The result of the comparison is latched in the comparator/latch circuit 104 and an output signal of the comparator/latch circuit 104 is output via line 106 to an output driver 108. The output driver 108 provides the output signal of the sensor system that is provided on output line 110. The sensor system shown in FIG. 1 further comprises an oscillator circuit 112, for example, a low-cost and low-power oscillator circuit, which provides a clock signal on line 114 to a counter 116 providing, via line 118, a count signal to a bias enable circuit 120 which, in turn, provides an enable signal on line 122 to the comparator/latch circuit 104 for controlling the operation thereof. The driver circuit 108 may also include a DfT block 124 (DfT="design for test") which provides for the possibility of testing one or more elements of the sensor system that may be formed in a common chip, for example during production of the chip, as is indicated by line 126.

The sensor system described with regard to FIG. 1 is implemented in the analog domain. During operation the sensor system senses a magnetic field, compares the magnetic field strength to switching points by means of the comparator/latch circuit 104, and switches the output at the end of each operating phase. The bias enable circuit 120 provides the current for operating the Hall sensor element 100 (see the dotted line 123 in FIG. 1) and other active elements, like the comparator/latch circuit 104. The driver 108 may be realized as an open drain output transistor receiving from the output latch in the comparator/latch circuit 104 the output signal.

The sensor system of FIG. 1 is implemented in the analog domain using the sensor element and the analog comparator. Such an analog approach usually scales as a "linear" function and does not allow using the advantages of newer technologies, like the use of digital approaches that scale as a "power-of-two exponential" function. Further, analog compensation principles that may be used are less deterministic as they depend on analog inaccuracies. Also, an analog-based DfT is more cost-inventive than a digital-based DfT.

A further disadvantage of analog implementations is that it is not possible to provide for a mixed switch/linear functionality. Further, when being implemented for performance, for example for providing digital outputs, analog solutions use several ADC designs operating continuously (there is no duty-cycle operation). Also, analog approaches implement the different functionalities in separate blocks, and such a modular concept has increased power requirements and cannot provide a power efficient realization of more complex functions. An further drawback is that the analog approaches are not very area-efficient, i.e. the footprint is high, e.g. it is in the range of 4-6 mm$^2$. Further, there is no focus on ultra-low power applications.

Therefore, there is a need for an improved and more efficient sensor system that is, for example, more area-efficient and more energy-efficient, and that may provide more functions.

The invention provides a digital sensor system, comprising a sensor element, an analog-to-digital converter coupled to the sensor element, and a wake-up circuit configured to activate the sensor element and the analog-to-digital converter in response to a predefined event.

In accordance with embodiments, the predefined event comprises at least one event selected from the following group: a predefined time, the lapse of a predefined time interval, a signal from a further sensor element having a predefined value, a reset signal, and a diagnosis signal.

In accordance with embodiments, the digital sensor system further comprises a digital signal processor coupled to the analog-to-digital converter.

In accordance with embodiments, the digital sensor system is configured to activate the digital signal processor in case a digital signal generated by the analog-to-digital converter fulfils a predefined criterion, in response to the activation of the sensor element and the analog-to-digital converter, or in response to the predefined event.

In accordance with embodiments, the predefined criterion is set upon manufacturing or initializing the digital sensor system, and wherein, during operation, the predefined criterion is fixed or is variable in response to a setting signal.

In accordance with embodiments, the digital signal processor is configured to modify the predefined criterion to obtain a new predefined criterion in response to the digital signal generated by the analog-to-digital converter, and to replace the present predefined criterion by the new predefined criterion.

In accordance with embodiments, the digital signal processor is configured to determine whether the digital signal generated by the analog-to-digital converter is within a predefined range, determine the existence of a potential disturbance or failure, in case the digital signal generated by the analog-to-digital converter is outside the predefined range, and cause a change of the predefined event and/or the predefined criterion so that the wake-up circuit activates the sensor element and the analog-to-digital converter more frequently, or so that the sensor element and the analog-to-digital converter are continuously operated for a predefined period of time.

In accordance with embodiments, the digital sensor system further comprises a memory coupled to the analog-to-digital converter, wherein the memory is configured to store the predefined criterion.

In accordance with embodiments, the digital signal processor is configured to be in a sleep mode when not being activated.

In accordance with embodiments, the digital signal processor is configured to provide, while being in the sleep mode, to the wake-up circuit a signal indicative of the predefined event, and to remain in or return to the sleep mode until activation.

In accordance with embodiments, the digital signal processor comprises a digital comparator coupled to the analog-to-digital converter and a signal processing circuit coupled to the digital comparator.

In accordance with embodiments, the digital sensor system comprises a first oscillator configured to generate a first clock signal which comprises at least the predefined event.

In accordance with embodiments, the digital sensor system comprises a second oscillator configured to be activated by the first clock signal and to generate a second clock signal having a higher clock frequency than the first clock signal for operating the analog-to-digital converter, wherein the second oscillator is configured to be deactivated when the processing of a sensor signal from the sensor element by the analog-to-digital converter is completed.

In accordance with embodiments, the digital signal processor is configured to be activated by the first clock signal and to generate a second clock signal having a higher clock frequency than the first clock signal for operating the analog-to-digital converter.

In accordance with embodiments, at least the sensor element, the analog-to-digital converter, and the wake-up circuit are formed as an integrated circuit chip, the integrated circuit chip comprising a circuit board on or in which the sensor element, the analog-to-digital converter, and the wake-up circuit are formed, and one or more external contacts coupled to the sensor element, the analog-to-digital converter, and the wake-up circuit.

In accordance with embodiments, the integrated circuit chip further comprises at least a part of the digital signal processor.

In accordance with embodiments, the integrated circuit chip further comprises an interface for coupling with an external digital signal processor.

In accordance with embodiments, the digital sensor system comprises a controller, wherein the controller is configured to cause the wake-up circuit to be activated or deactivated, wherein the digital sensor system is configured to operate continuously or intermittently, in response to an external trigger signal, when the wake-up circuit is deactivated.

In accordance with embodiments, the sensor element comprises one or more magnetic sensors, like an xMR sensor, a Hall sensor or a Spinning-Current-Hall-Sensor, or sensors measuring physical quantities like voltages, temperatures, currents for trimming or diagnosis purposes.

In accordance with embodiments, the wake-up circuit is configured to output a wake-up signal. In embodiments referring to switch functions, the switch output signals may be used as wake up signals as well.

In accordance with embodiments, the wake-up signal may comprise a pulse or a pulse code.

Embodiments of the invention are advantageous as they provide a new digital sensor system which is massively smaller than known sensor systems, for example ten times smaller than the above described analog sensor system (see FIG. 1), which has an area consumption of, e.g., 4-6 mm$^2$, while embodiments allow for a massively smaller implementation in an 0.35 µm low-cost technology, for example with a maximum target size of about 0.6 mm$^2$. Embodiments of the invention provide for a solution in the field of sensors which allows for low power designs, cost-efficient implementation with a focus on resource sharing, a combination of switch and linear functionalities in one design, thereby covering a broader target of emerging applications, a focus on better scaling digital functionalities, and introduce a concept to provide a digital microcontroller input and a digital value function (linear sensor data). Further, embodiments are advantageous as they provide for a highly efficient implementation without overhead for production testing, and a high resource sharing of design blocks for cost estimation vs. product features. For example, the above properties of the digital sensor system allows using also as a redundant sensor for functional safety design without adding much or substantial costs to the overall system.

Figure 2:
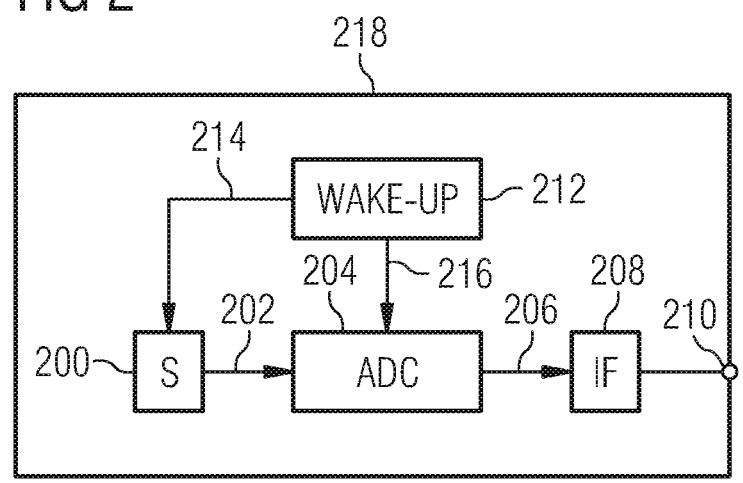
FIG. 2 shows a schematic block diagram of a digital sensor system in accordance with embodiments of the invention.

FIG. 2 shows a schematic block diagram of a digital sensor system in accordance with embodiments of the invention. The digital sensor system comprises a Hall sensor element 200. In accordance with other embodiments also other sensors may be used, for example other kinds of magnetic sensors, like an xMR sensor, or sensors sensing other physical properties. The sensor signal provided by the Hall sensor element 200 is output via line 202 to an analog-to-digital converter (ADC) 204, which converts the analog sensor signal into a digital representation of the sensor signal that is output via line 206 to an interface circuit 208 for providing the digital signal at an output 210 of the digital sensor system.

The digital sensor system includes a wakeup circuit 212 that is coupled via lines 214 and 216 to the sensor element 200 and to the ADC 204, respectively. The wake-up circuit 212 is provided to supply wake-up signals 214, 216 for activating the Hall sensor element 200 and the ADC 204 in response to a predefined event. The wake-up circuit 212, e.g., may provide a clock signal to the ADC 204 and cause that a current is provided to the Hall sensor element 200 to allow for the measurement of the magnetic field.

The predetermined event causing the wake-up circuit 212 to provide the signals 214, 216, for example, may be one or more of a predetermined or predefined time, the lapse of a predefined time interval, a signal from a further sensor element, either a sensor element which is internal to the digital sensor system of FIG. 2 or which is an external sensor element, an external reset signal or an external diagnosis signal. Furthermore, for multi-dimensional sensors (e.g. a 2D or 3D magnetic field sensor), the sensor 200 may be duplicated and multiplexed or parallel ADCs 204 and interfaces 208 may be used which may be controlled by the wake-up circuit 212. The wake-up circuit may be also parameterized using its own interface (not shown in FIG. 2) or one of the interfaces 208. The following embodiments illustrate some of the possible combinations.

In accordance with embodiments, the digital sensor system formed as an integrated circuit chip or die 218 comprising a circuit board, like a suitable substrate, and one or more pads or pins for defining external contacts. In FIG. 2, the output 210 schematically represents one of such pads/pins. The Hall sensor element, the ADC converter and the wake-up circuit are realized as integrated circuits in/on the circuit board, and the entire structure may be encapsulated.

Figure 3:
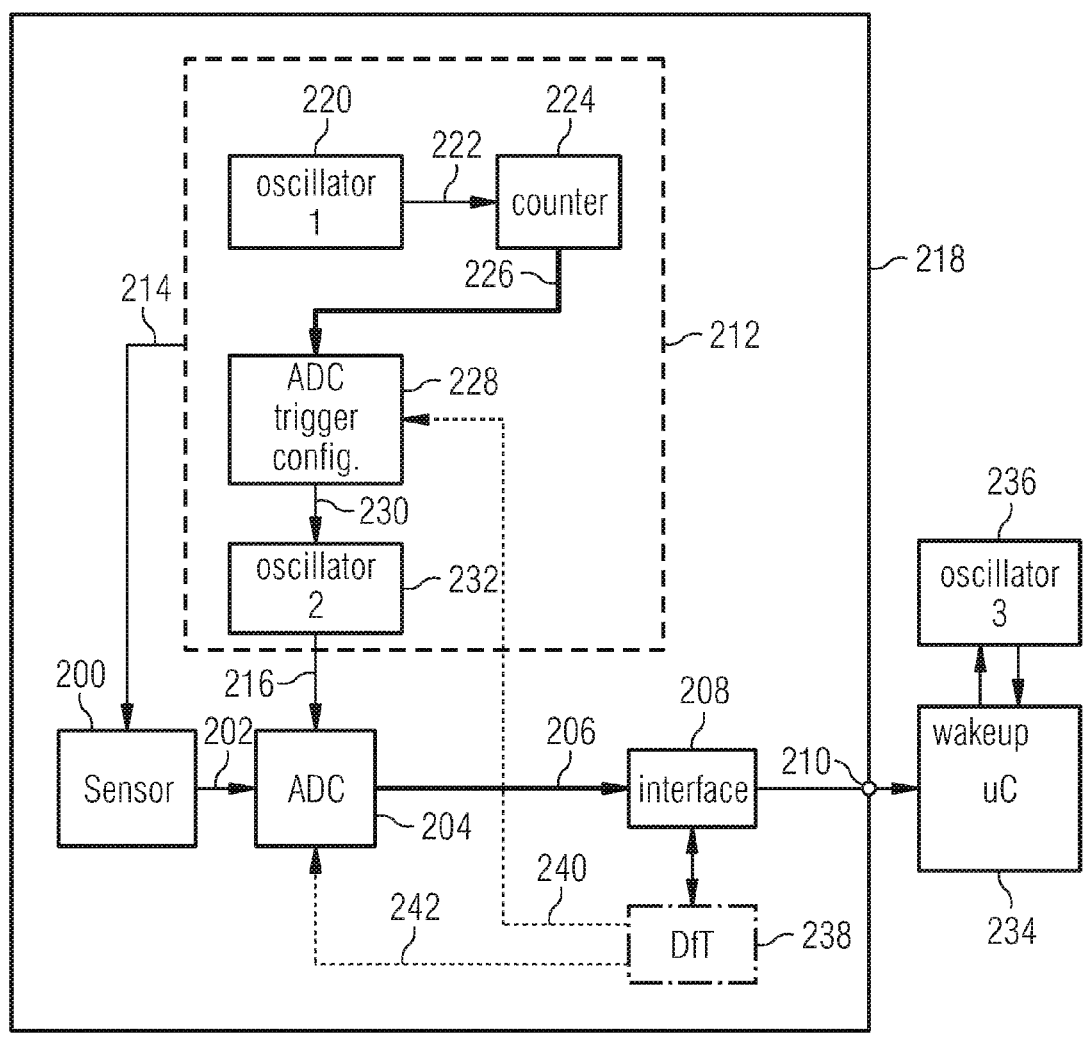
FIG. 3 shows an embodiment of a digital sensor system in accordance with the invention in which the wake-up circuit includes a low frequency, low-power oscillator providing a low frequency clock signal to a counter.

FIG. 3 shows an embodiment of a digital sensor system in accordance with the invention in which the wake-up circuit 212 includes a first oscillator 220 which may be a low-power oscillator operating at a low frequency and providing on an output line 222 a low frequency clock signal to a counter circuit 224. The output signal from the counter circuit 224 is provided via line 226 to an ADC trigger/configuration circuit 228 providing on line 230 a configuration signal used for operating a second oscillator 232 which provides on line 216 a second clock signal with a frequency higher than the first clock signal. The clock signal may be used for operating the ADC 204. Further, an external microcontroller 234 is shown that is coupled to the digital sensor chip 218 via the output 210, and which has associated therewith a third oscillator 236. The external microcontroller 234 may include a microprocessor.

The sensor system may further include the DfT ("design for test") circuit 238 coupled to the interface 208 and coupled via lines 240 and 242 to the ADC trigger/configuration circuit 228 and the ADC 204, respectively. The DfT circuit 238 allows for testing the sensor chip 218, for example during the production. The testing may include analog and/or digital testing of the functionality of the elements of the sensor chip 218 during production or in the field for diagnosis purposes.

In the embodiment of FIG. 3, the digital sensor system includes the first oscillator 220 providing the wakeup function, for example any raising edge of the clock signal provided by the first (slow) oscillator 220 may be counted by the counter 224 and once a predefined counter value has been reached, a trigger signal is output on line 226 which, via circuit 228, causes a wake-up of the second oscillator 232 which is used for performing a sensing action. The sensing action may include a single measurement or multiple measurements, e.g., multiple measurements over a predefined interval or time period. The multiple measurements within the interval may be taken periodically. The sensing action may include conversion of one or more measurement values from the sensor element using the ADC. Additional measurement signal processing circuitry may be provided to allow recognition of a threshold, to determine an average value of the sensor signals, or to allow trimming of the sensor output signal. Once the sensing action has been completed, the second oscillator 232 may be switched off again, and the external microcontroller or digital signal processing unit 234 may be activated (e.g., woken-up from a sleep mode) using the third oscillator 236.

In accordance with embodiments, the wake-up of the external microcontroller 234 may be triggered dependent on the result of the sensing action performed by the ADC, for example depending on the value of the signal output by the sensor system on line 206, so that only signals which are considered to be representative of a desired measurement value are further processed in the microcontroller 234. The data transfer to the microcontroller 234 may via an interface. In accordance with embodiments, the microcontroller 234, after having completed processing the received signal, may be turned off/deactivated.

In some implementations, the wake-up of the microcontroller 234 may be triggered by a wake-up signal provided at an output of the sensor chip 218, such as a digital signal provided at output 210. In some implementations, the wake-up signal may include a single pulse or a complex pulse (e.g., a pulse with multiple levels, a series of single pulses with one or more levels, and/or the like). Here, if the microcontroller 234 has access to information that describes a wake-up signal format (e.g., a pulse length of a single pulse, a format of a complex pulse, and/or the like), then the microcontroller 234 may identify a received signal as a wake-up signal (e.g., when a format of the received signal matches the wake-up signal format) and/or distinguish a wake-up signal from a signal resulting from, for example, an electromagnetic compatibility (EMC) event that causes a signal to be provided at output 210.

In some implementations, such as when the wake-up signal is a single pulse, the wake-up signal may be a so-called "interrupt signal" that causes microcontroller 234 to poll the digital sensor system (e.g., wake-up circuit 212) in order to determine information associated with the wake-up event (e.g., information that identifies a threshold that triggered the wake-up event).

In some implementations, such as when the wake-up signal is a complex pulse, the complex pulse may be used to send information to the microcontroller 234, which may eliminate a need for the microcontroller 234 to poll the digital sensor system after the wake-up. In such a case, a load on a bus and/or a latency (e.g., an amount of time to react to the event) may be reduced. In some implementations, the information included in the wake-up signal may include, for example, a coded identifier including information associated with the event (e.g., information that identifies which threshold level was crossed in which direction), a sensor value, and/or the like.

In contrast to a sensor-slave interface (e.g., serial peripheral interface (SPI)), some sensor interfaces may allow a sensor chip 218 to act as master on a bus associated with the sensor chip 218 and the microcontroller 234. Examples of such protocols include short pulse width modulation code (SPC), peripheral sensor interface 5 (PSI5), universal asynchronous receiver transmitter (UART), and/or the like. In some implementations, any interface and protocol that allows the same communication line to be used in a bi-directional fashion (e.g., such that components of the sensor chip 218 may take over communication with the microcontroller 234) may be used for one or more of the implementations described herein.

In some implementations, the microcontroller 234 may be connected to multiple digital sensor systems (e.g., multiple sensor chips 218 each including a sensor 200, a single sensor chip 218 including multiple sensors 200, and/or the like), each of which may individually provide information to the microcontroller 234. In some implementations, the microcontroller 234 can distinguish information provided by each digital sensor based on, for example, an identification code included in a transmission of sensor data. In some implementations, the microcontroller 234 may be capable of individually triggering the digital sensor systems to perform a sensing action (i.e., the microcontroller 234 may act as master).

In a case where the microcontroller 234 is in a sleep mode, the microcontroller 234 may not trigger the multiple digital sensor systems individually, but may individually configure wake-up of the respective sensors 200 in order to cause sensing actions to be performed. In such a case, the microcontroller 234 acts as a slave on the bus and a digital sensor detecting a wake-up event automatically takes over the bus as master. In this scenario, a load on the bus and/or a latency may be reduced when the digital sensor system can identify itself by, for example, providing information that identifies the digital sensor system in the form of pulse-coded information provided to the microcontroller 234.

In some implementations, such a pulse code may be similar to a protocol used on the bus. In some implementations, the digital sensor system may use its interface 208 to provide a wake-up frame that triggers the wake-up of the microcontroller 234.

In addition to allowing information associated with an event that caused the wake-up to be transmitted to the microcontroller 234, this also eliminates a need for an additional wake-up signal (e.g., an "/INT" signal) to be sent to the microcontroller 234.

Thus, in addition to the information described above for a single digital sensor system (e.g., including a single sensor 200), other information may be provided, such as information that identifies the digital sensor system that detected the wake-up event, an encoded wake-up signal that is similar to the regular sensor protocol, and/or the like.

While FIG. 3 shows the microcontroller 234 and the third oscillator 236 to be external elements, in accordance with embodiments the microcontroller 234 may also be implemented on the sensor chip 218 as a further integrated element of the sensor chip or sensor die 218 for providing the "on-chip" data processing of the digital representations of the measurement values provided by the ADC circuit 204.

Figure 4:
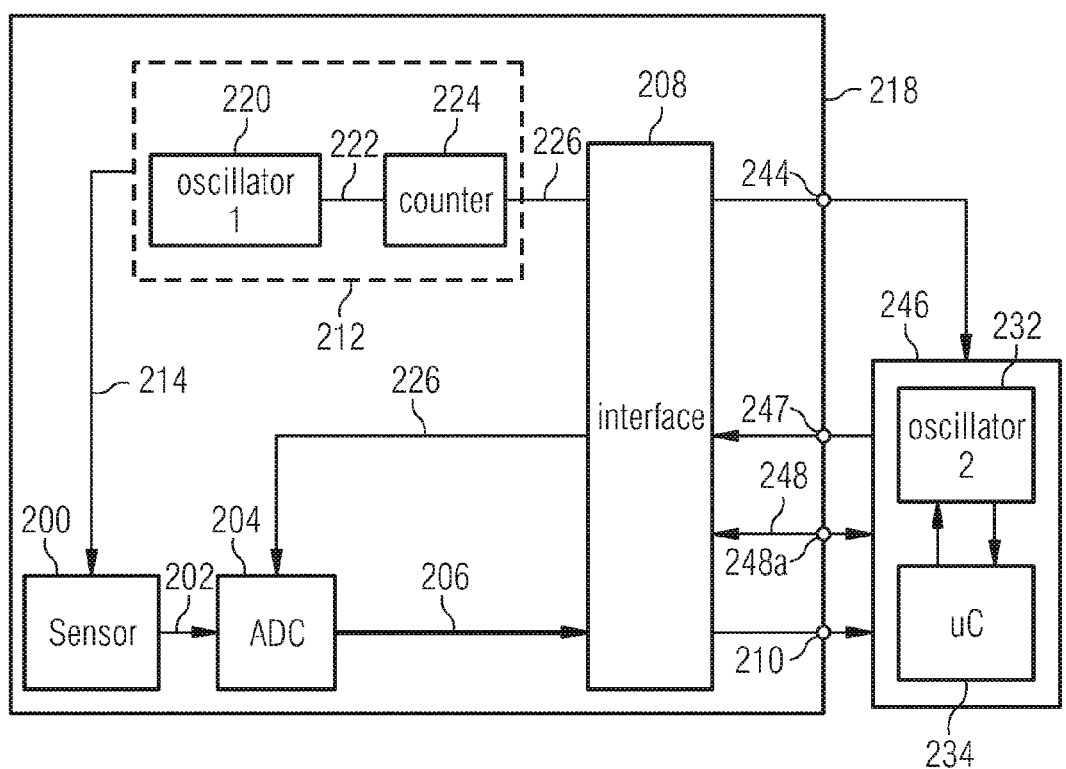
FIG. 4 shows a further embodiment of the digital sensor system of the invention, similar to the one of FIG. 3 in which the wake-up circuit outputs via an interface the trigger or activation signal.

FIG. 4 shows a further embodiment of the digital sensor system of the invention, similar to the one of FIG. 3. The structure is slightly different in that the wake-up circuit 212 comprises the first oscillator 220 and the counter 224 and outputs via the interface 208 the trigger or activation signal. Other than in FIG. 3, the trigger signal is output from the chip 218 via a pad/pin 244 of the die 218 to the external processing unit 246, which includes the second oscillator 232 and the microcontroller 234. The external processing circuit 246 is coupled to a clock pad/pin 247 of the die 218 to provide the activation signal on line 216 to the ADC 204 via the digital interface 208. The functionality of the sensor system of FIG. 4 is basically the same as the one of FIG. 3 in that the first oscillator 220 and the counter 224 provide for the wake-up functionality which, other than in FIG. 3, wakes up/activates the external microcontroller 234. The external processing circuit 246 comprises an external clock for performing the above mentioned sensing action. The external processing circuit 246 may control the sensor die 218 by providing control signals via the external control pin 248, the control line 248a and the digital interface 208. The control, in accordance with embodiment, may be bidirectional so that also signals may be output from the sensor die 218 to the external processing circuit 246. In accordance with embodiments the wake-up signal and/or the digital measurement values may be output via such a bidirectional interface instead of providing the dedicated pins 210 and 244. The control may cause converting one or more measurement values from the sensor and/or additional processing of the measurement values as described above.

During the sensing action or after completing it, the obtained digital data may be transmitted to the microcontroller 234, e.g. in case the measurement results fulfill one or more predefined criterions. Once the microcontroller 234 received the data it can be operated independent of the operation of the chip 218, which may be deactivated, and when the signal processing has been completed, the microcontroller 234 may also be deactivated/turned off again, for example by putting the microcontroller 234 or the external circuit 246 into a sleep mode. Like in the embodiment of FIG. 3, also in the embodiment of FIG. 4 the external processing unit 246, in accordance with embodiments, may be implemented as an integrated part of the sensor chip 218.

The embodiment of FIG. 4 is advantageous in that it requires less hardware compared to the embodiment of FIG. 3, however, it may consume somewhat more current and also requires additional pads/pins (external contacts), like the activation signal pin 244 and the clock pin 247.

Figure 5:
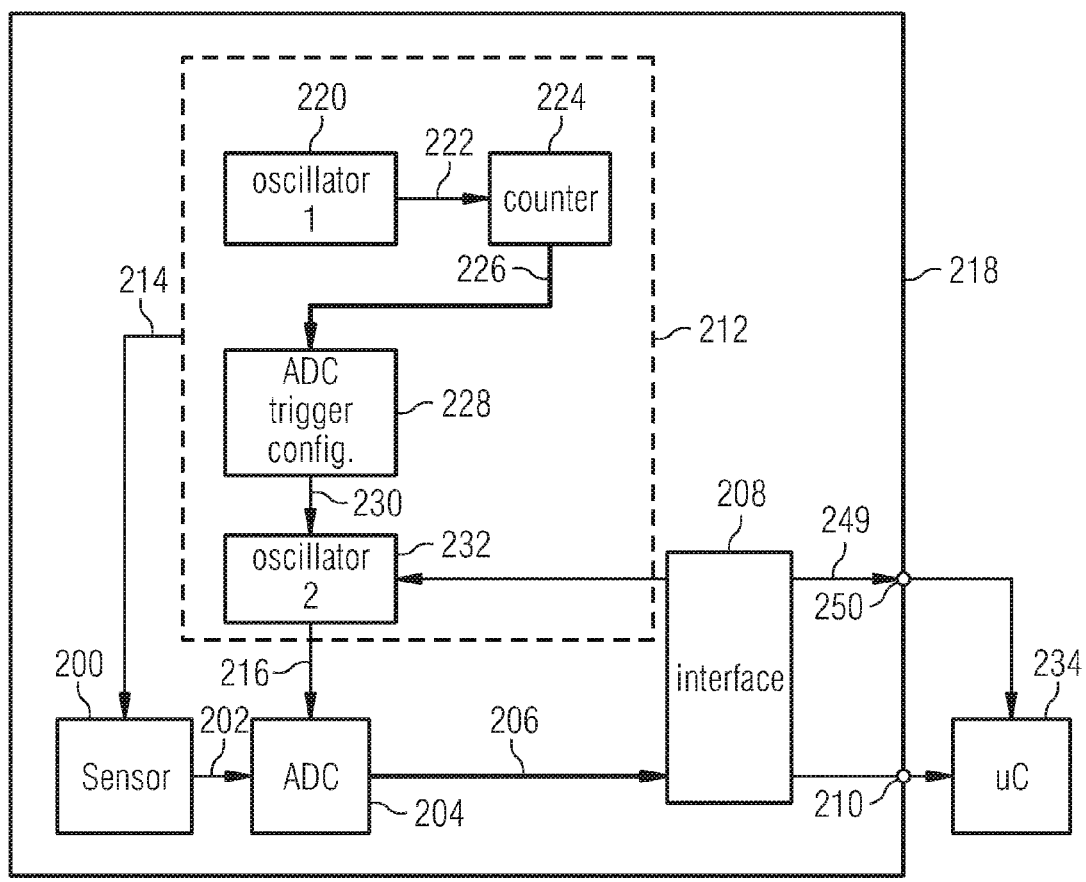
FIG. 5 shows another embodiment of the digital sensor system of the invention in which the microcontroller does not have associated therewith an oscillator.

FIG. 5 shows another embodiment of the digital sensor system of the invention in which the microcontroller 234 does not have associated therewith an oscillator. The microcontroller 234 is woken up/activated in response to the clock signal provided by the second oscillator 232 via line 249 and via pad/pin 250 of the die 218 to the microcontroller 234. The wake-up circuit 212 has the first oscillator 220 providing for the wake-up function together with a counter 224 starting the second oscillator 232. The second oscillator 232 may be used for performing the above mentioned sensing action and, at the same time, it may be used for waking up the microcontroller 234. In accordance with embodiments, the second oscillator 232 may be turned off once the microcontroller 234 completed the processing of the data and it may signal, via line 249, to the second oscillator 232 that the oscillator can be turned off again to return to the sleep mode.

FIG. 5 shows the microcontroller 234 to be an external element with regard to the sensor die 218, however, in other embodiments the microcontroller 234 may be integrated into the same die as the other elements of the sensor system shown in FIG. 5. The embodiment of FIG. 5 only requires two oscillators and thereby consumes as little current as in the system shown in FIG. 3, while requiring an additional output contact or pin, also referred to as a "additional clock pin" 250, needed for the communication between the microcontroller 234 and the second oscillator 232.

FIGS. 3 and 5 show embodiments of the digital sensor system including the first and second oscillators 220 and 232. In accordance with other embodiments, instead of using separate oscillators 220 and 232, one of which is a slow (low clock frequency) low-power oscillator and the other one is a quick oscillator with a higher current consumption, other embodiments may use an oscillator that can be operated in different modes. In the first mode a low frequency clock signal is output and once, for example by means of a counter a predetermined time period has lapsed, the oscillator is switched into the second mode providing a clock signal with a higher frequency than the first clock signal for operating the ADC for performing the sensing action.

With the regard to the oscillators described above, it is noted that the clock signal provided by the oscillator circuit may be either a clock signal directly obtained from the oscillator or it may be a clock signal obtained by multiplying or dividing an output signal from an oscillator in accordance with a predefined multiplier or divisor.

In the embodiments described above with regard to FIGS. 3, 4 and 5, it has been indicated that the microcontroller 234 is activated for performing the data processing on the digital data signals provided by the sensor chip 218. In the embodiments of FIGS. 4 and 5, the microcontroller 234 is automatically activated once the wake-up circuit 212 provides the trigger signal on line 226 (see FIG. 4) or once the second oscillator 232 has been activated (see FIG. 5). In the sensor system of FIG. 3, the microcontroller 234 has associated therewith its own oscillator 236 which allows operating the microcontroller 234 independent from the operation of the sensor chip 218. In accordance with embodiments, to reduce the power consumption of the overall system, the microcontroller 234 may only be switched on or activated once the signal, which has been processed by the sensor die 218 is within a predefined range, for example once the signal exceeds or falls below a threshold or lies inside a predefined window of values. Otherwise the microcontroller 234 may remain deactivated, for example it remains in the sleep mode.

In the above description of embodiments of the digital sensor system it has been indicated that the wake-up function is performed by providing the internal oscillator 220 (see FIGS. 3 to 5). However, other embodiments of the invention may alternatively or in addition use other (e.g., external) trigger signals causing a wake-up of the sensor and the ADC of the chip 218. For example, the sensor may be activated in response to a signal from another internal (inside the die 218) or external sensor, for example a temperature sensor or another sensor surveying the environment in which the sensor chip 218 is arranged. For example, only in case a predefined condition with regard to the environment is met, for which it is determined that a measurement using the digital sensor system is required, the system will be activated. As an alternative or further external trigger signal, a activation/deactivation signal from an overall controller may be provided to the circuit die 218. For example, when using the circuit die 218 in an automotive environment, the activation/deactivation of the sensor system may be governed by a central control unit of the vehicle, like the ECU. Yet another possibility for an external wake-up or trigger signal may be the provision of the wake-up signal by the microcontroller 234. In accordance with other embodiments, when a diagnosis of the sensor system is desired, the overall controller or the microcontroller 234 may trigger a wake-up of the sensor die 218 to see whether it reacts, i.e. is functional, and/or to perform some predefined measurement functions on the basis of which the functionality of the sensor die 218 may be evaluated.

A further embodiment of a digital sensor system in accordance with the invention will now be described with regard to FIG. 6. The embodiment of FIG. 6 allows operating the digital sensor system in a digital data mode and a switch mode at the same time, and the switch mode may be used to wake-up an external microcontroller (or alternatively a microcontroller integrated together with the other sensor elements) which then sets the sensor in the digital output mode or into the PWM mode (PWM=pulse width modulation) to perform more detailed measurements. The detailed measurements may include determining an average value of the sensor signals, or trimming of the sensor output signal. The subsequently described digital sensor system is advantageous because it provides three outputs, namely switch, PWM and digital value. The integrated solution has about the same size and a similar performance as a purely analog-based switch solution which, however, only provides for a single function, namely the switch function. Thus, the inventive concept of digitizing the sensor system allows using advanced technologies and allows making the design more effective and versatile when compared to purely analog solutions. The inventive concept underlying embodiments of the invention is therefore to be seen in a combination of a low-power oscillator, a counter, a low-power ADC, a digital comparator and a low-complexity digital interface for forming a versatile Hall sensor with a switch, a PWM and digital value output function in a single design with a chip size of a Hall switch.

Figure 6:
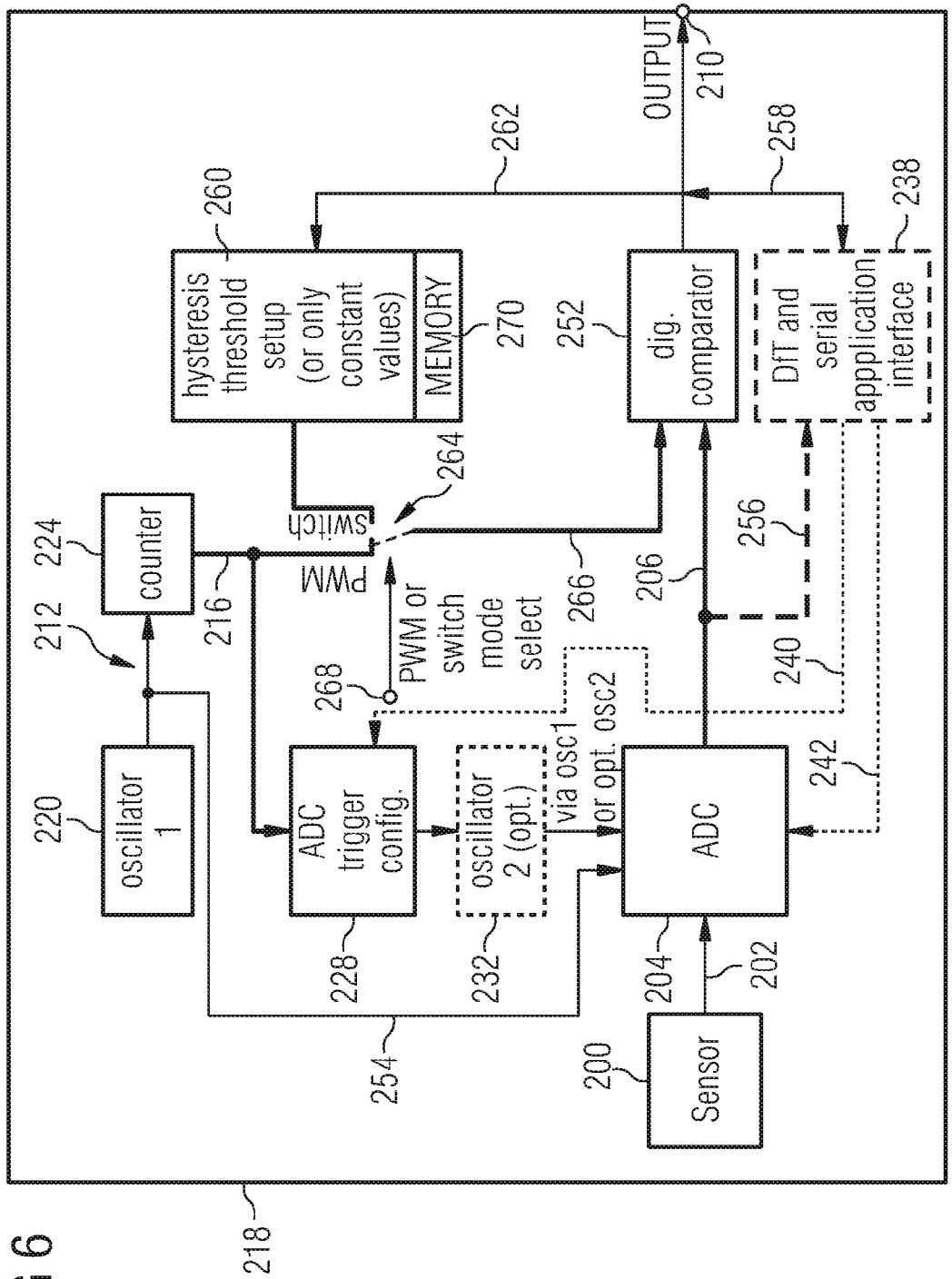
FIG. 6 shows a further embodiment of a digital sensor system in accordance with the invention operating in a digital data mode and a switch mode.

The embodiment of FIG. 6 shows a digital sensor system which further includes a digital comparator 252 coupled to the ADC 204 and receiving the digital version (i.e., the digital representation) of the sensor signal via line 206. The interface described in the earlier embodiments may be implemented as part of the digital comparator 252. The wake-up circuit 212 is similar to the one of FIG. 3, however, the oscillator 232 is shown as an optional element. In case it is provided, the wake-up circuit 212 has the same structure as in FIG. 3, however, as mentioned above the functionality of the first and second oscillators 220 and 232 may be provided by a single oscillator which can be switched between a first slow running mode and a second fast running mode. In this case, the second oscillator 232 would not be present and the circuit block 228 would be directly connected to the ADC 204. In such a scenario, the clock signal for operating the ADC 204 would be provided directly from the oscillator 220 via line 254. The oscillator 220 would be set into the second mode for providing the higher frequency clock signal to the ADC 204. In accordance with other embodiments, when using a single oscillator providing a low power oscillator signal with a low clock frequency, for example when providing only the oscillator 220 or a corresponding external clock signal via a clock pin, the ADC will be controlled using the "slower" clock signal which will reduce the current consumption at the expense of a somewhat higher processing time.

The digital sensor system may further include a hysteresis threshold setup circuit 260 that is coupled via line 262 to the output of the digital comparator 252. Further, a switch 264 is provided for selectively coupling the output of the counter 224 to a further input of the digital comparator 252 via line 266, or to couple an output of the hysteresis threshold setup circuit 260 via line 266 to the second input of the digital comparator 252. The switch 264 may be controlled by an external select signal for allowing selection between the PWM mode and the switch mode, the signal being received via a further control pin of the die 218 which is schematically represented at reference sign 268.

The digital sensor system in accordance with the embodiment of FIG. 6 uses a low power oscillator 220 and a low power counter 224, however, it is noted that in accordance with other embodiments the oscillator could be omitted and the clock signal could be provided by an external source via a digital interface formed by an additional clock pin of the chip 218. In accordance with embodiments, the sensor 200 may be a Hall sensor and the ADC 204 may be a SAT (Successive Approximation Tracker) ADC operated by the faster, second oscillator 232. In accordance with embodiments, also other ADC concepts may be applied.

The digital comparator 252 is provided to compare the ADC result against a constant or against the LP-counter value output by the counter 224. When comparing the ADC result against a constant, the sensor system is switched into the switch mode ("on/off output"), and the constant value may be stored in a memory 270. The memory may be part of the circuit 260 as is shown in FIG. 6. Alternatively, an additional memory element may be formed in/on the sensor die 218. In this mode, the switch 264 is activated in response to a switch signal at external contact 268 so as to allow a connection of the output of the circuit 260 to the second input of the digital comparator 252 for providing the constant value for comparison with the output of the ADC 204. When comparing the ADC result on line 206 against the LP-counter value, a PWM function "linear output" is provided and in this mode, the switch 264 is switched such that the output of the counter is connected to the second input of the digital comparator 252.

As an alternative or in parallel to the digital comparator 252, a low power, low cost, low-pin count digital interface may also be provided, like i2c, SICI, etc. for directly transferring the ADC data to an external microcontroller. In case the digital sensor system includes a DfT block, such an interface may typically be already present and may be reused also for transferring the data to an external microcontroller implementing the functionality of the digital comparator. In other words, in the embodiment of FIG. 6, the digital comparator, which is shown as an integral part of the sensor system, may also be realized as an external element, in a way similar to the microcontrollers described with regard to FIGS. 3, 4 and 5.

During operation, the ADC 204 is triggered by the second clock signal having the higher frequency compared to the clock signal used for the wake-up function. The second, higher frequency clock signal may be provided by the second oscillator 232 or by the first oscillator 220 in a second mode. Alternatively, as described earlier this signal may also be provided by an external source (see FIG. 4). The ADC 204 is triggered with a given duty cycle provided by the low-power counter 224 to provide for the above mentioned switch function. For performing the PWM function, the ADC is typically triggered with slopes provided by the low power oscillator 220. Alternatively, as described with regard to FIG. 4, the ADC may also be triggered by an external signal received from an external microcontroller.

While the embodiments described earlier use a single sensor, it is noted that also more than one sensor may be provided on the integrated circuit chip 218. The multiple sensors may be multiplexed on the ADC input, and the digitized signals may be output sequentially via the digital interface. The digitized signals may share a digital comparator and provide the results on separate output pins, for example one pin for PWM and one pin for switch. Alternatively, the signals may be provided as a logic combination of the comparator results.

Figure 7:
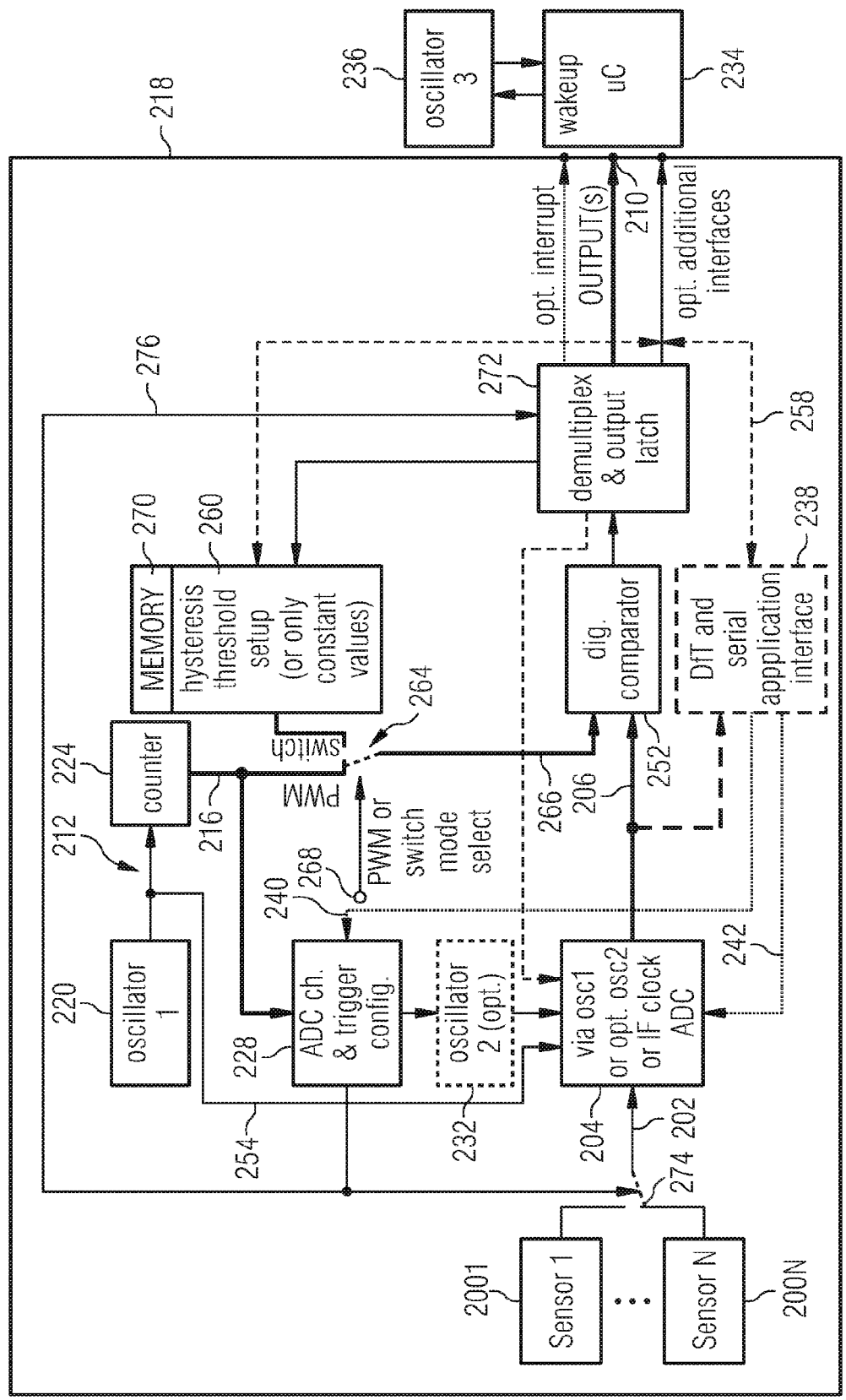
FIG. 7 shows an embodiment of the digital sensor system of the invention using multiple sensors and providing, via a single output, either a multi-dimensional switch (logic combination of decisions) as well as a one-dimensional PWM output and a one-dimensional linear output.

FIG. 7 shows an embodiment of the digital sensor system of the invention using multiple sensors and providing, via a single output, either a multi-dimensional switch (logic combination of decisions) as well as a one-dimensional PWM output and a one-dimensional linear output. When compared to FIG. 6, the embodiment of FIG. 7 comprises the demultiplex/output latch circuit 272 that is coupled between the digital comparator 252 and the output 210 of the digital sensor system. In addition, a plurality of sensors $200_1$ to $200_N$ are provided, the outputs of which are selectively coupled to the input of the ADC 204 by means of a switch 274. The demultiplex/output latch circuit 272 controls both the switch 274 and the circuit 228 via line 276. Providing the demultiplex/output latch circuit 272 allows performing the measurements from the plurality of sensors sequentially. The individual measurements form the respective sensors are the same as described earlier. In FIG. 7 the external microcontroller 234 and the external third oscillator 236 are also shown, which in accordance with other embodiments may also be integrated as part of the sensor chip 216. While it has been described with regard to FIG. 7 that the digital sensor concept described with regard to FIG. 6 may be extended to multiple sensors so as to provide a multi-dimensional sensor system, it is noted that also the other embodiments described earlier may be used for implementing a multi-dimensional linear sensor, for example the digital sensor system described with regard to FIG. 3.

Another embodiment may use the plurality of sensors for acquiring additional diagnosis information based on physical properties within the sensor system as temperatures, voltages or currents. This quantities may reflect the state of a sensor/ADC signal biasing, the internal supply condition, on-chip stress effects or other distortions which can lead to an erroneous sensor system.

Figure 8:
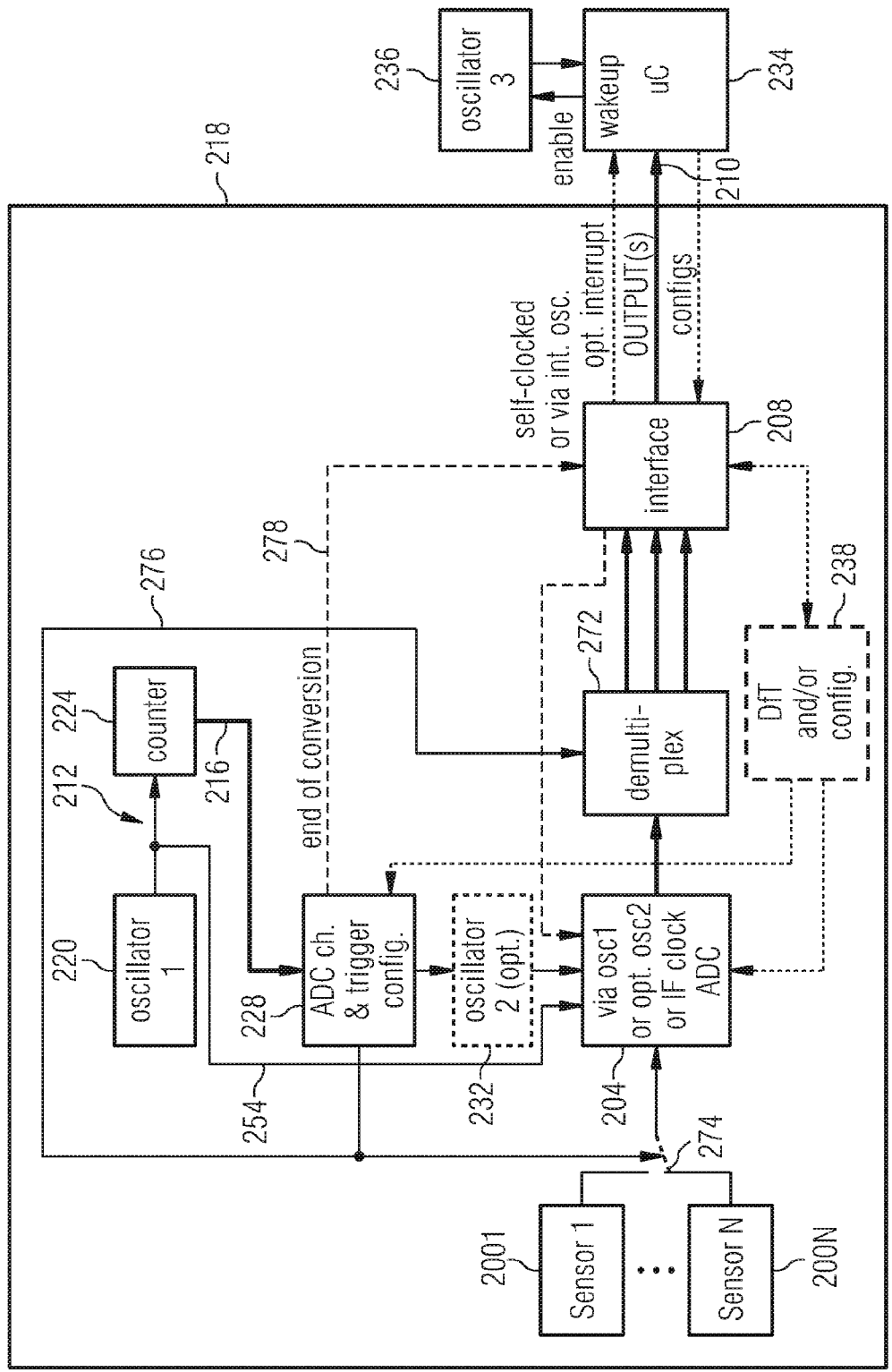
FIG. 8 shows a multi-dimensional digital sensor system on the basis of the sensor system of FIG. 3.

FIG. 8 shows a multi-dimensional digital sensor system on the basis of the sensor system of FIG. 3. When compared to FIG. 3, FIG. 8 includes a plurality of sensors $200_1$ to $200_N$ as well as a demultiplex/output latch circuit 272 controlling the switch 274 and the ADC control circuit 238. The switch 274 allows connecting the outputs of the respective sensor selectively to the input of the ADC 204. The demultiplex/output latch circuit 272 is connected between the output of the ADC and the input of the interface 208 and provides a plurality of output lines connected to the input of the interface. The circuit 238 further outputs an end of conversion signal via line 278 to the interface so as to deactivate or put the interface into the sleep mode once the conversion has been completed for reducing power consumption.

Figure 9:
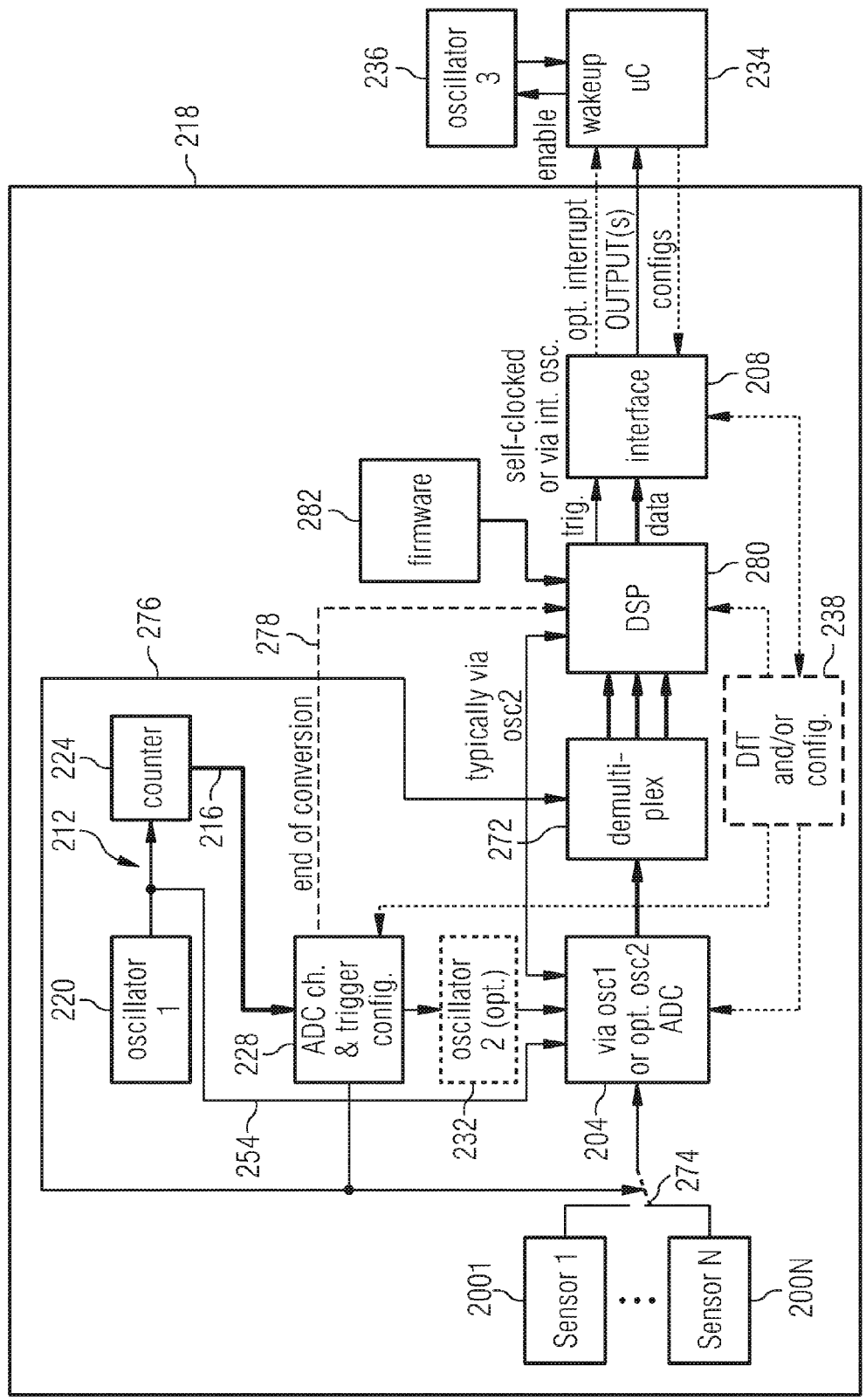
FIG. 9 shows yet another embodiment in accordance with which the digital sensor system of the invention includes an on-chip digital signal processor.

FIG. 9 shows yet another embodiment in accordance with which the digital sensor system of the invention includes an on-chip digital signal processor 280 that is connected between the demultiplex/output latch circuit 272 and the interface 208. When compared to the embodiment of FIG. 8, in addition a firmware memory 282 is provided that is operatively coupled to the DSP 280 for providing the necessary firmware information for operating the DSP. Also, when compared to FIG. 8, the end of conversion signal 278 is applied to the DSP and not the interface for indicating to the DSP the end of the conversion and the time after which it can return into the deactivated state/sleep mode. The provision of the additional digital signal processing circuit 280 allows for further processing the signals generated by the ADC prior to outputting them to the microcontroller 234, for example the measurement results may be trimmed or some kind of data processing may be applied. In addition, application handling may also be performed. While FIG. 9 shows the embodiment using the DSP in a multi-dimensional sensor system, it is noted that in accordance with further embodiments the DSP can also be used in a single dimensional sensor arrangement, for example by providing the DSP in the embodiment of FIG. 3 between the output of the ADC and the input of the interface.

Figure 10:
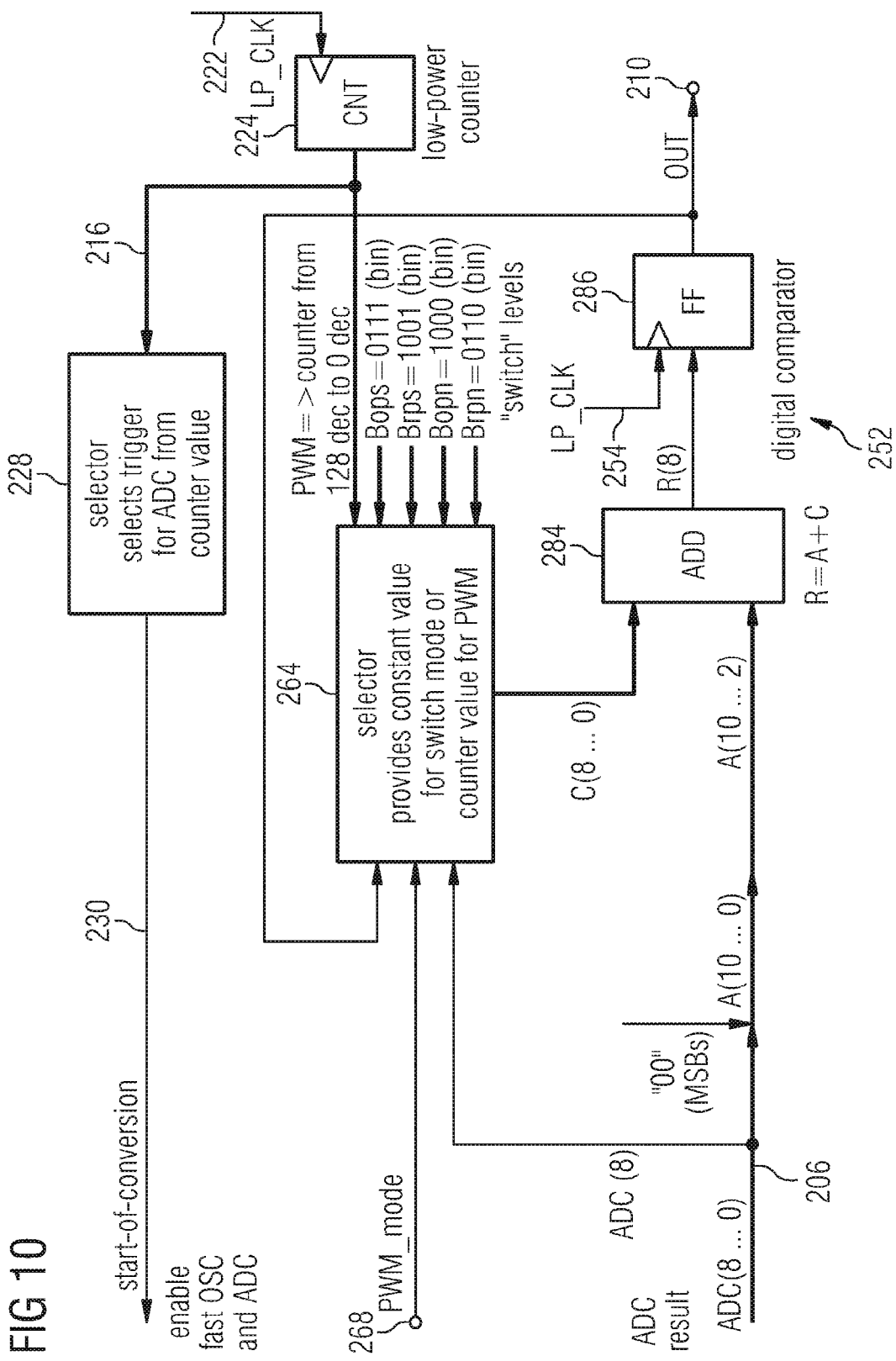
FIG. 10 shows an embodiment for a low power control and digital comparator concept for switch and PWM operations without unnecessary hardware overhead.

FIG. 10 shows an embodiment for a low power control and digital comparator concept for switch and PWM operations without unnecessary hardware overhead, as it can be used in any of the above referenced embodiments in which a digital comparator is implemented. The low power counter 224 receives via line 224 the clock signal from the low power oscillator 220 (not shown in FIG. 10) or from an external clock pin of the integrated circuit. On output line 216 the counter 224 outputs the respective counter values via the selector 264 to the input of the digital comparator 252. The selector 264 is controlled by the mode signal applied via pin 268 and either provides the counter values on line 216 to the input of the digital comparator to implement the PWM function or, when being put into the switch mode, provides the switch level input signals dependent on the clocked digital comparator output signal 210 to the input of the comparator 252 to form a switch function with hysteresis function.

In the embodiment shown, four switch levels for two positive ADC input values and two negative ADC input values may be provided, which are additionally selected by the MSB of the ADC result 206, namely ADC(8), acting as sign bit for this value. In another embodiment without hysteresis function, these multiple levels and comparator output signal may not be needed and just a fixed switch level may be provided, one for the positive and one for the negative ADC value 206 determined by the MSB acting as the sign bit. In further embodiments, only a single level may be detected and thus only one level may be passed to the digital comparator and the ADC(8) input may be not needed as well. In this embodiment, digital comparator 252 is formed of an adder 284 receiving at a first input the ADC result on line 206 and at its second input the signal via selector 264. A less area intensive comparator function is described later with reference to FIG. 20, however, also other digital comparator structures may be used. The output of the adder 284 is connected to the flip-flop 286 that is clocked using a clock signal which may be the low power oscillator clock signal provided on line 254. Alternatively, when providing a second oscillator or an external oscillator signal, the flip-flop may be clocked using the second, higher frequency clock signal. The output of the flip-flop 286 is output to the output or pin 210 of the sensor die. It should be mentioned that the above described principle may also be used in embodiments with more than one ADC signal in accordance with which the ADC signals may be provided in parallel or sequentially. In such embodiments the ADC input signals, switching levels and output signals (e.g. when using three channels for a 3D sensor) may be multiplexed. Furthermore, yet other embodiments may use less or more bits for the ADC result and the switching levels.

Figure 11:
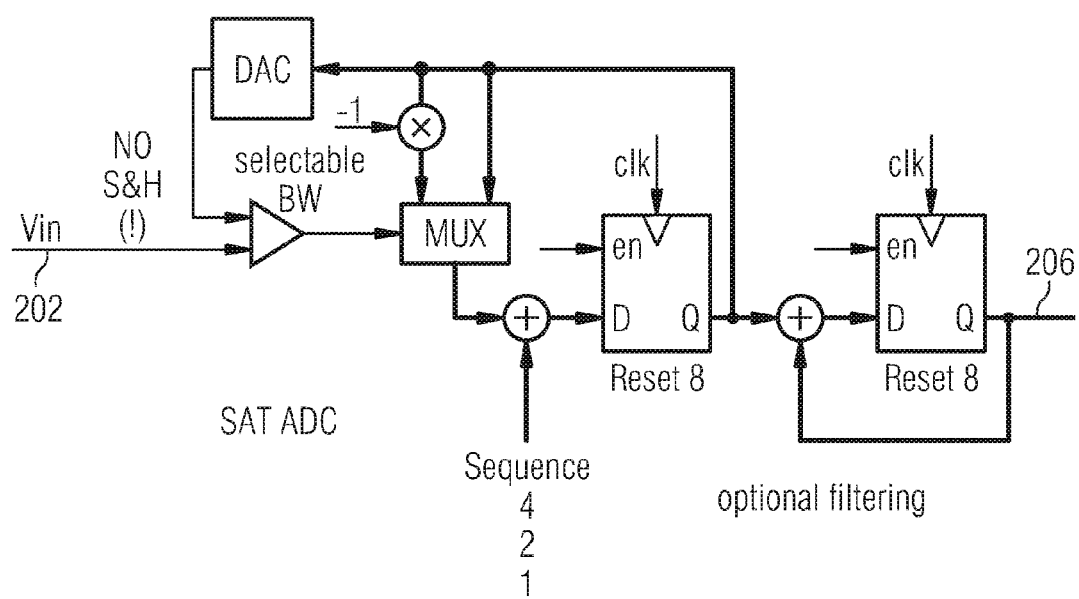
FIG. 11 shows an exemplary implementation of an analog/digital converter as it may be used in accordance with embodiments of the invention.

In the above described embodiments, the ADC 204 has been described in general. In accordance with embodiments, a low power SAT (Successive Approximation Tracker) ADC is used for implementing the ADC 204. However, also other concepts for analog/digital conversion can be applied. FIG. 11 shows an exemplary implementation of an analog/digital converter as it may be used in accordance with embodiments of the invention. More specifically, FIG. 11 shows a low power SAT (Successive Approximation Tracker) ADC as a possible implementation for the analog/digital converter in the inventive digital sensor system. The ADC shown in FIG. 11 is described in detail, e.g., in U.S. application Ser. No. 14/319,177, the contents of which is herewith incorporated by reference. The ADC of FIG. 11, initially may operate using large binary steps which become smaller (approximation mode). Eventually, the ADC may enter to the tracking mode in which the step is limited to 1 bit. Besides the implementation described in FIG. 11, also other known implementations of analog/digital converters may be used in combination with the inventive concept described in the present application.

Figure 12:
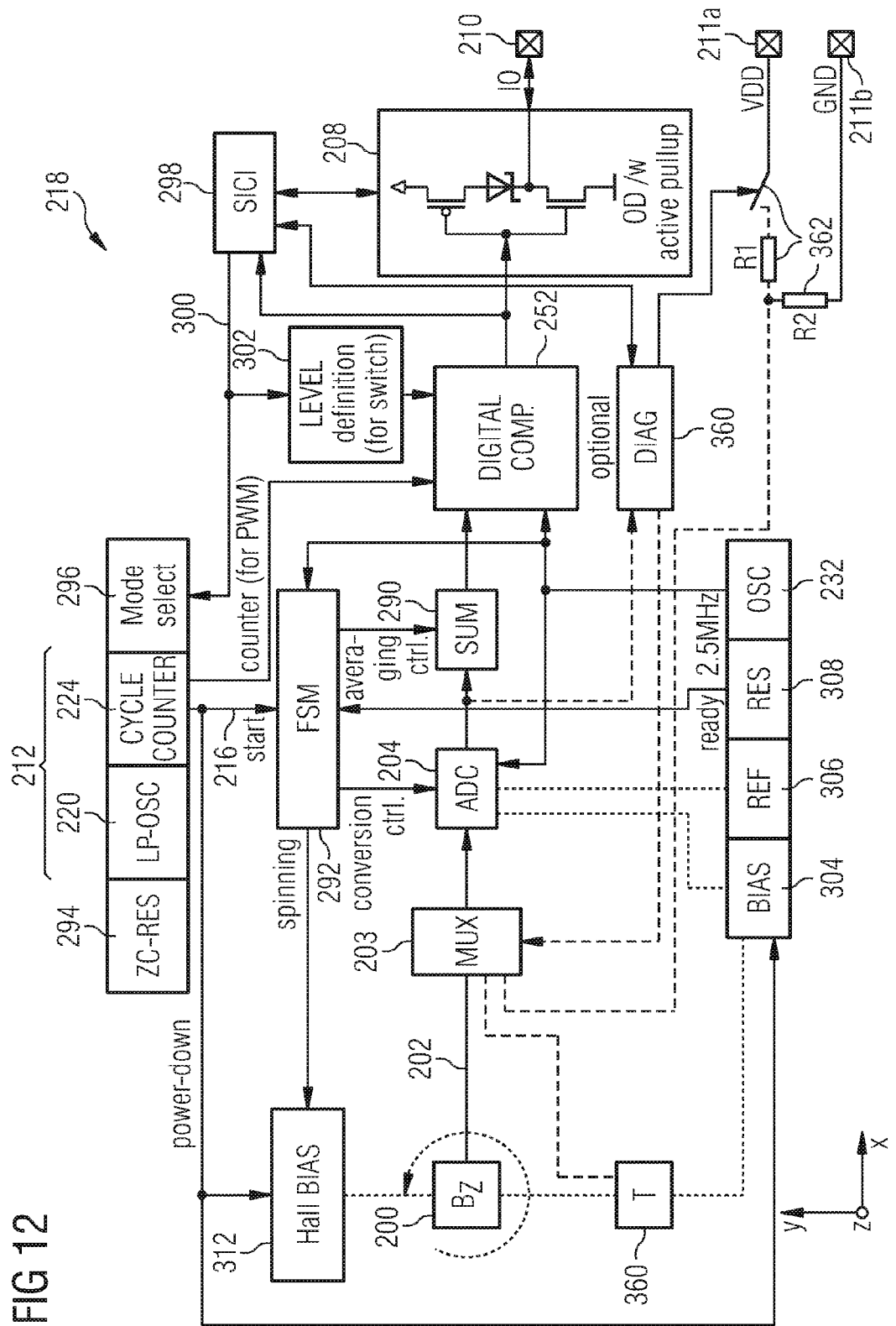
FIG. 12 shows a simplified block diagram of an integrated circuit die for implementing the digital sensor system in accordance with an embodiment.

FIG. 12 shows a simplified block diagram of an integrated circuit die 218 for implementing the digital sensor system in accordance with an embodiment. The digital sensor system comprises the Hall sensor 200 which is arranged for sensing a magnetic field vertical to a surface of the chip which is assumed to be arranged in the x/y plane so that in the described embodiment a detection of a magnetic field in the z-direction can be sensed by the sensor 200. The sensor signal is output via the line 202 to a multiplexer 203 which is connected to the analog/digital converter 204. The analog/digital converter 204 is connected to the digital comparator 252 via an averaging circuit 290. The output of the digital comparator 252 is supplied to the output pin 210 of the chip 218 via the interface 208 implementing an output driver. The wake-up circuit 212 is formed by the low power oscillator 220 and the cycle counter 224. The output of the cycle counter 224 is coupled to a finite state machine (FSM) 292 via the line 216. The FSM 292 is coupled to the analog/digital converter 204 and to the averaging circuit 290 and may provide control of these circuits. The sensor chip 218 further includes the second oscillator 232 providing a clock signal with a frequency higher than a clock signal of the oscillator 220 to the ADC 204, the averaging circuit 290 and also to the digital comparator 252 and the FSM 292. On the basis of the clock signal the just mentioned digital circuits are operated.

The sensor system chip 218 further comprises a zero-current power-on reset function as is indicated at reference sign 294 and a mode select function 296. The mode select block 296 receives via an interface 298 and a line 300 a mode select signal indicative of whether the chip 218 is to be operated with a switch output, a digital data output or a PWM output. The interface may be a SICI interface (see, e.g., US 2013/0094373 A1, the contents of which is herewith incorporated by reference). In accordance with other embodiments, another interface in accordance with digital protocols may be used, like LIN, SPC, PSI5, I2C. The interface 298 is coupled to the output driver and as is indicated by the double headed arrow between the output driver and the pin 210, an I/O contact is provided so that via this pin also a select signal for the interface 298 may be provided. A level definition block 302 is connected to the digital comparator 252 for providing, in the switch configuration, the reference value for comparison with the ADC result. In accordance with embodiments, the circuit block 302 may include a memory unit for storing the reference value. The reference value may be additionally dependent on the last comparator output to form a hysteresis function so that the level provided to the comparator 252 will change between two predefined levels based on the on state and the off state of the comparator output to allow a window for avoiding switching due to a noisy signal, as explained for FIG. 10. The required signal line for a hysteresis function from comparator 252 to level definition 302 is not shown in the FIG. 12. The output of the counter 224, for the PWM configuration, is connected to the digital comparator and, dependent on the operation mode selected, either the counter value or the constant value is applied to the digital input of the digital comparator. Furthermore, in other embodiments the comparator 252 may be implemented as a more complex event detector for a given switching level, as will be explained later with reference to FIGS. 19 to 21F.

The circuit chip 218 further comprises a bias circuit 304, a reference circuit 306 and a reset circuit 308. The bias circuit and the reference circuit are coupled to the ADC 204, and the reset circuit 308 is coupled to the FSM 292. The bias circuit 304 is coupled via a temperature sensor 310 to the sensor element 200. The circuit comprises a Hall bias circuit 312 for the Hall sensor element 200. The FSM 292, for implementing a spinning operation, is also coupled to the Hall bias circuit 312. The output of the cycle counter 224 is coupled to the sensor bias 312 and to the bias 304 for causing starting/powering down of the system.

Additionally, a diagnosis system incorporating a diagnosis unit 360 may be provided which controls the multiplexer 203 to lead alternative quantities to the ADC 204. This may be an on-chip temperature measurement, a voltage measurement or any other quantity to be checked during operation. In this case, the temperature trim for the Hall probe 200 additionally delivers a PTAT-voltage (PTAT=proportional to absolute temperature) to ensure the sensor operates within its operating temperature conditions and a resistive divider 362 checks that the sensor operates within its operating supply voltage conditions.

The integrated circuit chip including the digital sensor system as described with regard to FIG. 12 allows a sensor to be operated in three different modes by an appropriate control of the digital comparator 252. In the PWM mode the comparator compares the actual ADC value to a counter value to form a PWM output. In the switch mode, the comparator 252 compares the actual ADC value to a threshold which may be set via the interface 298. The threshold value may be a fixed value or may be based on a last decision from the comparator to implement a hysteresis function. To allow the setting of the threshold on the basis of the last decision, the output of the comparator 252 is connected also to the interface 208 as shown in FIG. 12. The interface 298 may also be used for providing an external wake-up signal for activating the sensor and the ADC as well as the other processing circuits, like emergency wake-ups in case of a failure diagnosed by unit 260. In an interface mode, the comparator 252 may be used as a wake-up, and the ADC 204 may be directly read out via the interface.

The functionality of the circuit of FIG. 12 in the PWM mode and the switch mode will now be described in further detail. In the PWM mode, the output of the cycle counter 224 is connected to the input of the digital comparator and the integrated circuit 218, in this configuration, has three main functional units having the following building blocks:

A power management part comprising the PWM finite state machine 292, the low-power oscillator 220, the zero-current (power-on) reset 294, the basic biasing 304, the band gap reference 306, an accurate reset 308 and the fast oscillator 232.

A sensing part comprising the Hall biasing 312, the Hall probe 200 and the successive tracking ADC 204 with summation register 290 for averaging of the Hall spinning cycles, optionally controlled by the FSM 292.

An interface part comprising a digital comparator 252, the open-drain interface 208 and the pin 210.

The power management system controls the power distribution in the integrated circuit shown in FIG. 12 and provides a zero-current power-on reset function and the low-power oscillator 220 as a clock source. The power management runs on the basis of the cycle counter 224 handling the measurement cycles and the start-up behavior. Upon start-up (via the zero-current reset) the power management part activates the biasing 304 and 306, the accurate reset detector 308 and the fast oscillator 232, and initiates a first measurement for the first PWM cycle. During operation, the low-power oscillator 220 controls the cycle counter 224 which causes an activation of the biasing 304, 306, an activation of the Hall biasing 312, of the accurate reset detector 308 and the fast oscillator 232. It also controls a start of the conversion of the Hall probe voltage, provided it is above the accurate reset level, and following the ADC measurement it causes storing the value to be used for the next PWM cycle, and then it enters the power-down mode in which only the low-power oscillator 220 is running.

The sensing part performs the measurements of the magnetic field. In accordance with embodiments, the Hall probe 200 is connected to a 9 bit ADC, and the measurement is performed sequentially, with spinning and chopping, using the dedicated finite state machine 292. The ADC 204 uses a successive approximation tracker mechanism (SAT converter) comprising a DAC and a comparator. Each cycle comprises the following steps:

it starts to compare the Hall probe output on line 202 to the middle DAC setting (MSB bit set), the comparator 252 decides if the Hall probe value is below or above the DAC value, which causes the next bit (MSB-1) to be added or subtracted from the last value, the comparison and adding/subtraction being continued for all bits down to the LSB, after that, the SAT converter 204 continues on the LSB comparison for another eight clock cycles to average the noise of the Hall probe 200, the cycle is performed four times while switching the current through the Hall probe in all four directions to average out an offset of the Hall probe 200. Optionally, also a two-spin method may be enabled to reduce power consumption for the sake of offset accuracy.

A temperature compensation may be performed in the analog domain. Alternatively, it is also possible to modify the temperature behavior of the sensitivity of the sensor to cope with certain magnet types, for example by a "metal-programming" with a derivative design.

The interface part includes the PWM comparator 252 and the interface 208 which, in accordance with embodiments, do not require the fast oscillator 232, which makes the function thereof very power efficient while limiting the speed a little due to the use of the low power oscillator 220. The comparator 252 compares the ADC result to the cycle counter 224 driven by the low-power oscillator 220 which results in a 6 bit PWM output. The PWM includes clamping to limit the PWM ratio to 1/64 and 63/64, respectively. The PWM ratio without magnetic field is about 32/64, and the ratio changes linearly to the applied magnetic field towards the just mentioned clamping limits. With regard to the reset, is noted that a reset event of the accurate reset unit operated during the ADC conversion will not reset the ADC value, nor the cycle counter nor the comparator result, but only inhibits the ADC conversion. Only a complete supply failure, which is detected by a zero-current reset block 294, will reset the cycle counter.

When operating the integrated circuit chip of FIG. 12 in the switch mode, the input to the digital comparator is defined by the values stored in the block 302, the output signal from the counter 224 is not used. The main functional units of the integrated circuit in this mode are as follows:

A power management system comprising the PMU finite state machine 292, the low-power oscillator 220, the zero-current (power-on) reset 294, the basic biasing and band gap reference 304, 306, the accurate reset 308 and the fast oscillator 232.

A sensing part comprising the Hall biasing 312, the Hall probe 200 and the successive tracking ADC 204 with summation register 290 for averaging Hall spinning cycles, all controlled by the FSM 292.

An interface part comprising the digital comparator, the compare-level selection with hysteresis, the open-drain interface 208 and the pad 210.

The power management system controls the power distribution in the IC 218 and provides a zero-current power-on reset function as well as the low-power oscillator 220 as the clock source. The power management system runs on a cycle counter 224 handling the measurement cycles and the start-up behavior. On start-up, via the zero-current reset, the power management unit activates the biasing 304, 306, the accurate reset detector and the fast oscillator 232. Also a first measurement and a first comparator decision is initiated. During operation, the low power oscillator controls the cycle counter 224, which activates the biasing 304, 306, the Hall biasing 312, the accurate reset detector 308 and the fast oscillator 232. Further, the Hall probe voltage is converted, provided it is above the accurate reset level, and after the ADC measurement, it causes switching of the output. Following this, the power-down mode is re-entered so that only the low-power oscillator 220 is running.

The sensing part performs the measurement of the magnetic field. The Hall probe is connected to the ADC 204, and the measurement is performed using the dedicated finite state machine FSM. In case of a plurality of sensors, the measurements are performed sequentially, and in both cases of a single sensor or multiple sensors, the measurement is performed with spinning and chopping using the FSM 292. The ADC may use, in accordance with embodiments, a successive approximation tracker mechanism described above with regard to FIG. 12 which comprises a DAC and a comparator, and during cycles the following steps may be performed:

a comparison of the Hall probe output with the middle DAC setting is compared, the comparator 252 decides if the Hall probe value is below or above the DAC value, which cases the next bit (MSB-1) to be added or subtracted to the last value, the comparison and adding/subtraction is continued for all bits down to the LSB, the SAT converter continues on the LSB comparison for another eight clock cycles to average the noise of the Hall probe 200, and the cycle is performed four times while switching the current through the Hall probe and all four directions to average out an offset of the Hall probe 200. Optionally, a two-spin method may be enabled to reduce power consumption for the sake of offset accuracy.

A temperature compensation may be performed in the analog domain based on the output from the temperature sensor 310. Alternatively, it is also possible to modify the temperature behavior of the sensitivity of the sensor to cope with certain magnet types, for example by a "metal-programming" with a derivative design.

The interface part is provided with the comparator 252 and the interface 208 which may not require the fast oscillator 232 which makes it very power-efficient while slightly reducing the speed due to the limitation of the clock cycle provided by the low-power oscillator 220. The comparator compares the ADC result to fixed levels for the switch, depending on the output state of the digital comparator when implementing an hysteresis function. In FIG. 12, the output of the comparator is fed back via the interface 298 to the block 302.

A reset event of the accurate reset unit operated during an ADC conversion will not reset the ADC value, nor the cycle nor the comparator result, but only inhibits the ADC conversion. Only a complete supply failure, which is detected by the zero current reset block 294 will reset the cycle counter.

Figure 13A:
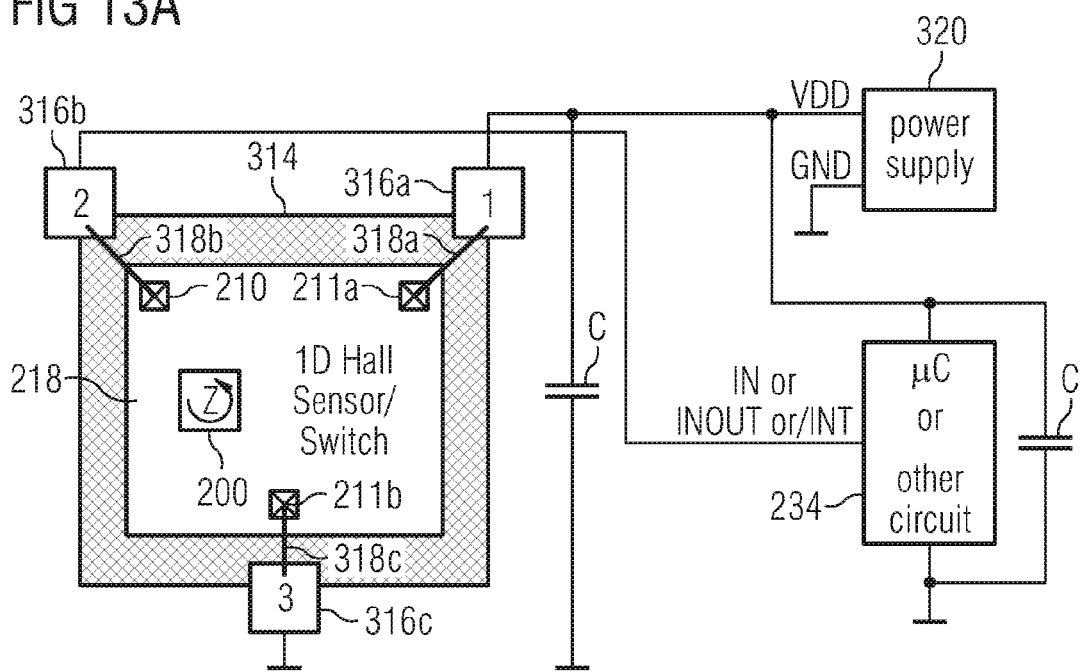
Figure 13B:
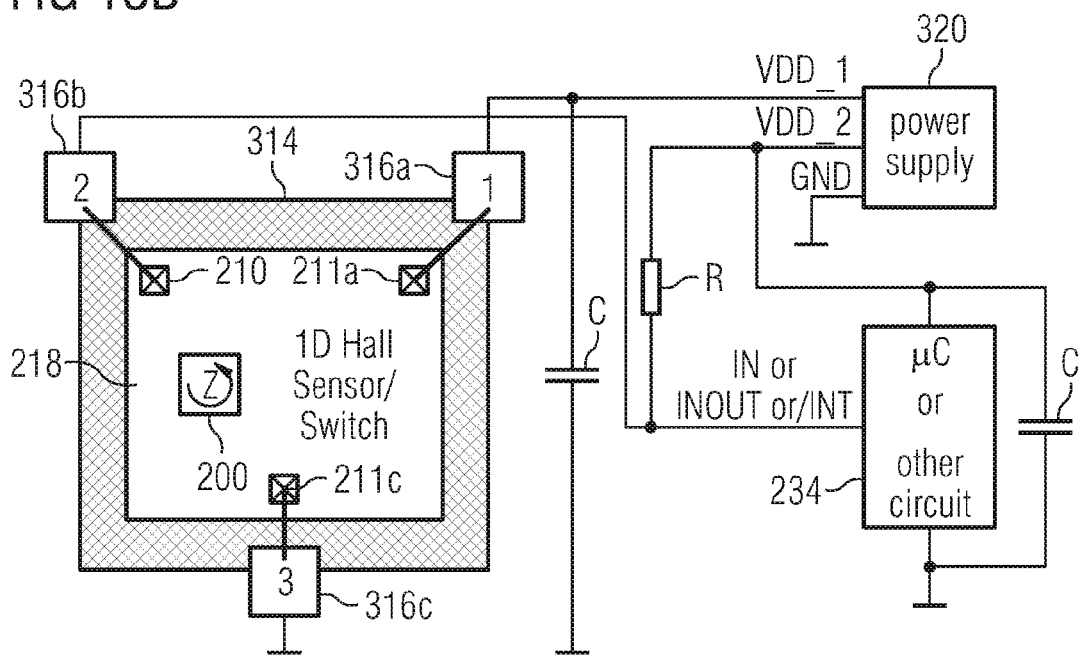

FIGS. 13A and 13B show embodiments for application circuits of the inventive digital sensor system. In FIGS. 13A and 13B, application circuits for a sensor IC as described with regard to FIG. 12 is shown. In FIG. 13A the sensor chip 218 having the sensor element 200 and the additional elements described earlier (not shown in FIG. 13A) is attached to a circuit board or lead frame 314 having respective contacts 316a, 316b and 316c. The integrated circuit sensor chip includes in addition to the contact 210 for providing the input and/or output also the contacts 211a and 211b of which contact 211a is for receiving a supply voltage VDD which is supplied among the respective active elements in the sensor chip (the respective wiring not being shown in FIG. 12 for maintaining the clarity of the drawing). The contact 211b is for connecting the internal circuitry of the IC sensor chip 218 to ground or to a reference potential (again, to maintain the clarity of the drawing, the respective wiring for connecting the ground terminal 211b to the respective elements inside the IC is not shown). As can be seen from FIG. 13A, the respective external contacts 210 and 211a and 211b are connected to the respective contacts 316a to 316c by bond connections 318a to 318c. In other embodiments, the IC chip 218 may be connected in a different way to the respective terminal 316a to 316c, for example by flip chip bonding or other known approaches. The application circuit shown in FIG. 13A further includes a power supply 320 as well as the microcontroller 234. The power supply provides for the supply voltage VDD that is applied to the sensor chip 218 via contact 316a and contact pad 211a. The power supply 320 further provides the supply voltage to the microcontroller 234. The input/output pad 210 of the IC chip is connected via the bond connection 718a and the external contact 316b to an input/output of the microcontroller 234, and the contact 316c is coupled to a reference potential, like ground. In the embodiment of FIG. 13A the application circuit is provided for all interface options, and the sensor supply equals the interface supply.

FIG. 13B shows a further embodiment in which the sensor chip 218 and the microcontroller 234 receive different supply voltages VDD_1 and VDD_2 provided by the power supply, which is useful in cases where the supply of the microcontroller 234 needs to be switched off to save power. In case such power saving is desired, the external pull-up resistor R or an internal microcontroller pull-up resistor needs to be omitted to avoid current through the pull-up resistors when the second supply is lower than the sensor supply. In FIGS. 13A and 13B, the integrated circuit 218 provides an open-drain output with an internal, active pull-up which eliminates the need for an external resistor, as is shown in FIG. 13A. The internal pull-up also allows using on this output pin a higher voltage than the sensor supply using an external pull-up resistor, as is shown in FIG. 13B, wherein current flow in this situation may be prevented by providing an internal Schottky diode.

The signal between the sensor 218 and the microcontroller 234, as shown in FIG. 13A and FIG. 13B, may be connected to an input pin, an input/output pin or a special interrupt pin depending on the capabilities of the microcontroller and in case a special wake-up configuration, polling or interrupt function is required for the plurality of existing microcontroller implementations on the market, containing themselves signal- or microprocessors and further peripherals required for the application. The output option may be needed to control parameters of the sensor, like switching levels for the wake-up function or sending diagnosis commands. Alternatively, in other embodiments, the configurations shown in FIG. 13A and FIG. 13B including the sensor 218, the power supply 320 and the microcontroller 234 may be integrated completely or partially in any combination on a single silicon die.

Figure 14:
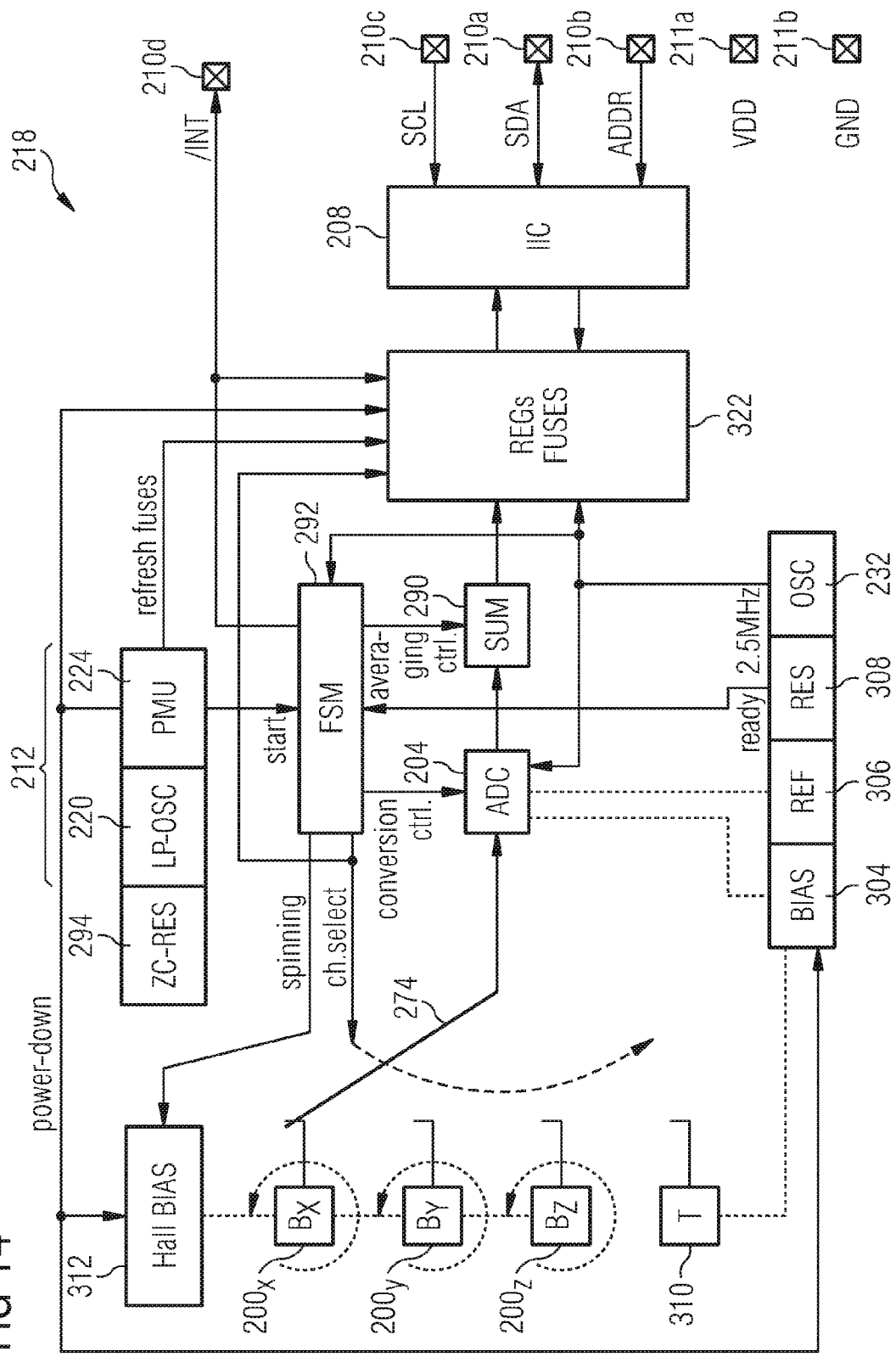
FIG. 14 shows a further embodiment of the inventive digital sensor system implementing a 3D sensor chip.

With regard to FIG. 14 a further embodiment of the inventive digital sensor system implementing a 3D sensor chip is shown. The sensor chip is provided with one lateral and two vertical Hall sensors for converting the signals from three Hall probes and three axes. Further, a temperature sensor is provided, and the signals from the respective sensors are provided to a microcontroller. The sensor chip in accordance with the embodiment of FIG. 14, when compared to the embodiment of FIG. 12, does not include a digital comparator, rather a register/fuse block 322 is provided, and in addition to the supply and ground pads 211a and 211b, a plurality of I/O pads 210a to 210d is provided. The integrated circuit 218 comprises three main functional units, namely:

The power management part comprising the PMU finite state machine 224, the low-power oscillator 220, the zero-current (power-on) reset block 294, the basic biasing and band gap reference 304, 306, the accurate reset 308 and the fast or second oscillator 232.

The sensing part comprising the Hall biasing 312, the Hall probes 200x, 200y and 200z, with the multiplexer represented by the "switch" 274, and the successive tracking ADC 204 with summation register 290 for averaging of the Hall spinning cycles and both controlled by the finite state machine 292.

The interface part comprising the IIC interface 208, the register file/fuse block 322 and the I/O pads 210a to 210d.

The power management system controls the power distribution in the integrated circuit 218, provides a zero-current power-on reset function and the low-power oscillator 220 as a clock source. The power management part runs on the dedicated finite state machine 224 handling the power modes and the start-up behavior as follows. On start-up, or via a IIC soft reset, the power management unit activates the biasing 304, 306, the accurate reset detector 308 and the oscillator 232, reads out the fuse setting and latches the ADDR pin 210b, enters the power mode set by the fuses. A default setting may be that all biasing 304, 306, 312 and the oscillator 332 are switched off. Depending on the power mode selected, the power management is performed on a regular basis. When an activation is to be performed, the biasing 304, 306, the accurate reset detector 308 and the oscillator 322 are activated as well as the Hall biasing 312. Then the three Hall probe channel outputs are sequentially converted with an optional conversion of the PTAT voltage (temperature measurement from the sensor 310). Following the measurement, the power management part causes the system to enter the low-power mode again, for example by returning to the default settings. In accordance with embodiments, the above mentioned functions of the power management part are executed if the supply voltage is high enough, otherwise the accurate reset circuit will hold the state machine until the required level of the supply voltage is reached and continues its operation afterwards. The functions are also restarted if a reset event occurs in between.

The sensing part performs the measurement of the magnetic field. The Hall probes $200_x$, $200_y$ and $200_z$ are connected to the multiplexer 274 which is also connected to the ADC 204.

The measurements of the three channels are performed sequentially using the dedicated finite state machine (FSM) 292. The ADC, in accordance with the embodiments of FIG. 14, may use a successive approximation tracker mechanism (SAT converter) comprising a DAC and a comparator (see FIG. 11). Each cycle may comprise the following steps:
  comparing the Hall probe output with a middle DAC setting (MSB bit set),
  deciding, by the comparator, if the Hall probe value is below or above the DAC value, which causes the next bit (MSB-1) to be added or subtracted to the last value,
  continuing the comparison and adding/subtraction for all bits down to the LSB,
  continuing with the ASD converter on the LSB comparison for another eight clock cycles to average the noise of the Hall probe,
  performing this cycle four time while switching the current through the Hall probe in all four directions to average out the offset of the Hall probe. The temperature measurement is performed in the same way, however, instead of a Hall probe the first multiplexer input is connected to the PTAT (proportional to absolute temperature) voltage from the biasing circuits.

The IIC interface requires two pins, namely the SCL input pin 210c and the SDA in/output pin 210a in open-drain configuration. In addition, in accordance with the depicted embodiment, two pins are provided which may be shared with the IIC pins in specific packages, namely the interrupt output pin/INT 210d in open-drain configuration, which may be shared with the SCL pin, and the address select input pin ADDR 210b that may also be shared with the SDA pin.

The interface part does not require the internal oscillators to be active, so that it can be operated in any power mode of the sensor IC 218. The IIC interface may perform a chip reset initiated by a master, independent of the used IIC address. The values of the measurements from all three axes are stored in separate registers, and after a power-on reset or after a soft-reset using the IIC interface, these registers will read zero. An additional temperature value register may exist which also reads zero after a power-on or a soft-reset. A reset event of the accurate reset unit operated during the ADC conversion will not reset the values stored, but only inhibits the ADC conversion. Only a complete supply failure which is detected by the zero-current reset block will reset this register and initiate a new power-on cycle to be executed.

Figure 15A:
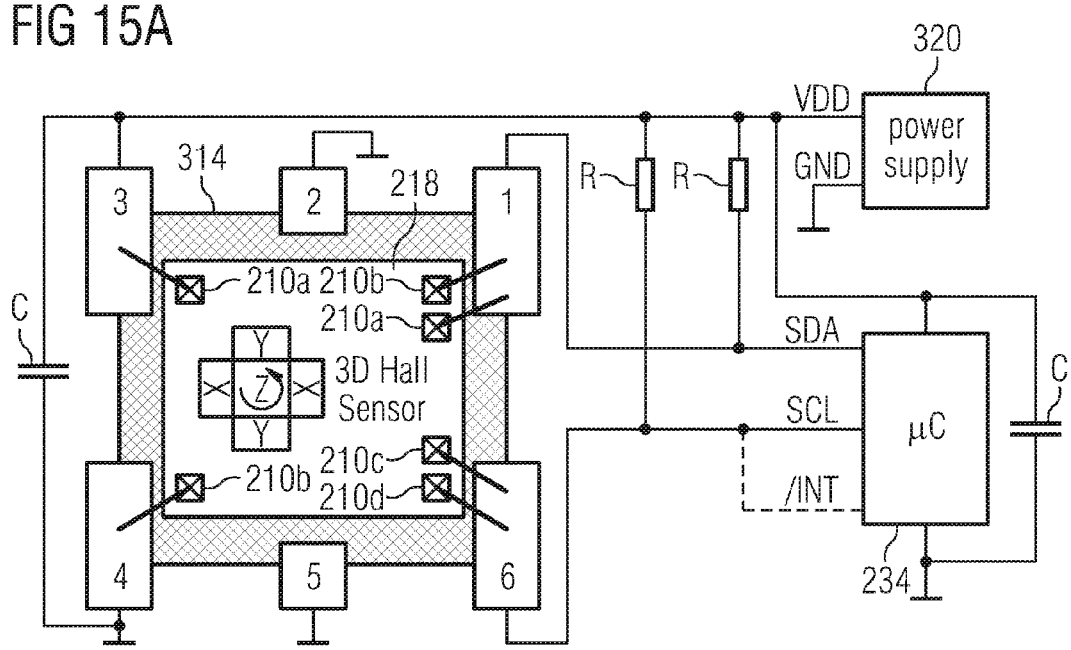
Figure 15B:
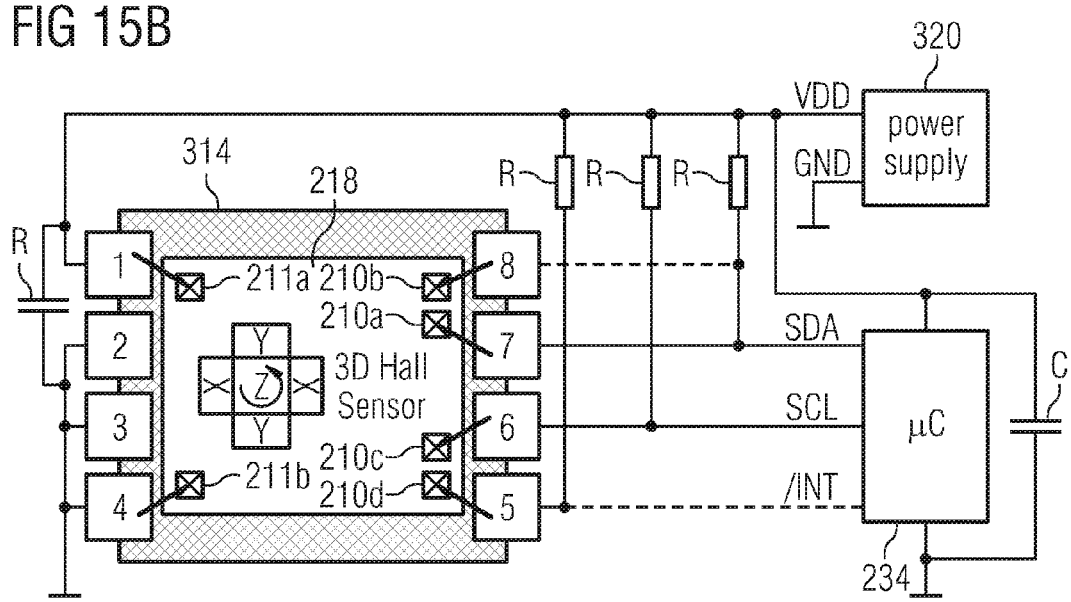

FIGS. 15A and 15B show embodiments of application circuits that may be used for IC sensor chips as described in FIG. 14. Dependent on the package, the IIC bus is either shared with the additional address-select and interrupt pad or not. Specific application circuits are now described for possible package variances, and in both cases described below, the use of an interrupt line is optional, however it is preferred to provide such an interrupt line to ensure proper and efficient readout of the sensor data.

In FIGS. 15A and 15B, in a similar way as in FIGS. 13A and 13B, the sensor IC 218 is mounted to a circuit board or a lead frame 314 having, in the embodiment of FIG. 15A six pins (pins 1 to 6) or as shown in the embodiment of FIG. 15B eight pins (pins 1 to 8). The respective contact pads of the IC circuit 218 are connected by bond connects or other suitable connections to the respective pins, as is depicted in FIGS. 15A and 15B. In FIG. 15A the ADDR pad and the SDA pad (pads 210a and 210b) are connected to the pin number 1 for connection to the microcontroller 234. The interrupt pad and the SCL pad (pads 210c and 210d) are connected to the pin number 6 and are also connected to a further input of the external microcontroller 234. In FIG. 15B the SDA pad and the ADDR pad may be connected to different pins (pins number 7 and number 8), and also the SCL pad and the interrupt pad may be connected to different pins (pins number 6 and 5). With regard to FIGS. 15A and 15B it is noted that the ADDR may be connected to SDA, VDD or GND. Further, the/INT line may be shared with an open-drain/INT output of other sensors.

FIG. 16 shows a conversion scheme in a "low-power mode" of the sensor IC described with regard to FIG. 14. In the low-power mode the interrupt signal/INT is generated by the low power oscillator and the low power counter and triggers the ADC measurements and wakes up the external microcontroller.

FIG. 17 shows a conversion scheme when the IC sensor shown in FIG. 14 is operated in a fast mode. The signal/INT is generated at the end of a continuous ADC sampling and wakes up the external microcontroller. This mode may be enabled if the master/microcontroller desires to measure with a higher bandwidth a certain signal after its wake up.

Figure 18:
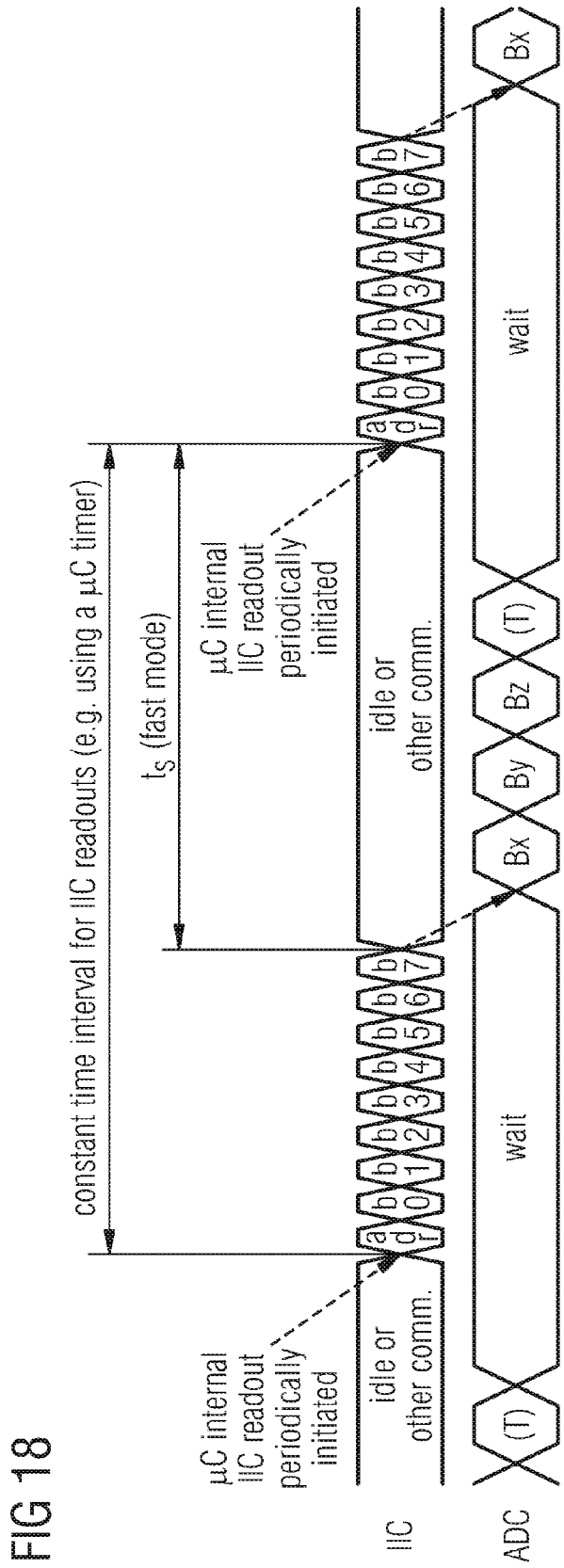
FIG. 18 shows a conversion scheme that is triggered after a transmission from a master controller which allows the master to control the sampling time points.

FIG. 18 shows a conversion scheme that is triggered after a transmission from a master controller which allows the master to control the sampling time points.

The above description of embodiments of the invention was made with respect to Hall sensors, however, the invention is not limited to such a kind of sensors. Also other magnetic field sensors may be used, like xMR sensors or splitting-current-Hall sensors. In other embodiments, sensors measuring other properties may be used, e.g., sensors measuring other physical quantities, like voltages, temperatures, currents etc. Also combinations of such sensors may be integrated in the inventive sensor die. In other embodiments the additional sensors may be used for diagnosis or trimming purposes of the magnetic sensors. Also, the embodiments described so far uses only a single ADC, however, instead of using for multiple sensors a multiplexed analog-to-digital converters, also separate analog-to-digital converters for separate measurement channels or for different groups of measurement channels may be used. The inventive approach may be applied to any kind of sensor system using active sensors, for example sensors that need to be activated for allowing them to make a measurement.

As described above, the integrated circuit sensor chip may comprise a memory element, for example a volatile memory, for receiving the values used either by the ADC converter or by the digital comparator or by another digital processing means for processing the measurement signal from the probe. For example, threshold values may be provided by the microcontroller and may be stored by a volatile memory, like a register or a RAM, of the IC sensor chip. Alternatively, the IC sensor chip may comprise a non-volatile memory, like an EEPROM or a flash memory for holding the threshold values. Preferably the non-volatile memory can be written multiple times so that, for example, initial threshold values may be modified or corrected later, for example by overwriting them by new values from the microcontroller.

In accordance with the embodiments using Hall sensors making use of the two or four phase spinning current system, it is preferred to digitally compare the threshold to two or four summed or averaged digital ADC results. In embodiments using xMR sensors or other sensors an additional digital/analog converter may be used for re-converting the digital measurement signals into the analog domain and using an analog comparator for performing the threshold comparison in the analog domain. This allows using the DAC and the comparator cells twice as they are also used for the ADC function, for example the SAR-ADC is formed by a DAC followed by a comparator and a SAR register (see FIG. 11).

The threshold values may be superimposed by hysteresis values or by an overlaid+/−signal so as to fulfill a desired function, for example threshold value 1=threshold value−hysteresis/2 and threshold value 2=threshold value+hysteresis/2. Alternatively, one may use two threshold values for each channel to be measured (for example for each axis to be measured of a magnetic field), i.e. the lower and upper threshold values can be stored directly. Also, a non-symmetrical hysteresis or a window comparator with an additional hysteresis may be applied.

To save the space for a register on the IC chip holding the sensor system, it may be preferred to store a threshold value for each channel but only a single hysteresis value or a single window comparator value, and the finally valid threshold values can then be calculated from the original threshold values and the absolute or relative overlap of the hysteresis or the window values. The window values can also apply to a sensor signal direction, for example a positive magnet field signal, or alternatively to positive and negative sensor signals. A fixed or relative hysteresis or window comparator threshold may be fixedly stored in the sensor so that for a 3-channel sensor only three threshold registers are needed.

In accordance with embodiments, when using high voltage applications, e.g. applications using a VDD of 18 V or 24 V, an additional high voltage-depletion-transistor may be provided for limiting the operational voltages, especially for the digital register and for the low power oscillator. This allows powerless control of the high voltage protection.

Further embodiments may also implement a watch dog function in the system.

In accordance with embodiments, the wake-up circuit outputs a wake-up signal which may be a specific pulse or a specific pulse code. In such an embodiment, in case of a non-operating sensor system, the wake-up signal will not just be a continuous low or a high level signal, rather, the wake-up signal has a specific pulse or a specific pulse code so that, e.g., the external controller may distinguish the wake-up signal from a completely non-operating sensor system outputting, e.g., due to a malfunction of a clock generator, only a low or high lever signal.

In the following an embodiment for implementing an event detector will be described in detail. The event detector may be implemented as part of the ADC trigger/configuration circuit 228 (see FIGS. 3 to 9) and may operate on the basis of the counter value from the counter 224. In cases of other events, like external events, a digital signal representative of the event may be provided and processed by the event detector. In such a scenario, the wake-up circuit 212 shown in FIG. 2 may comprise the event detector without the need of the oscillator and counter.

Figure 19:
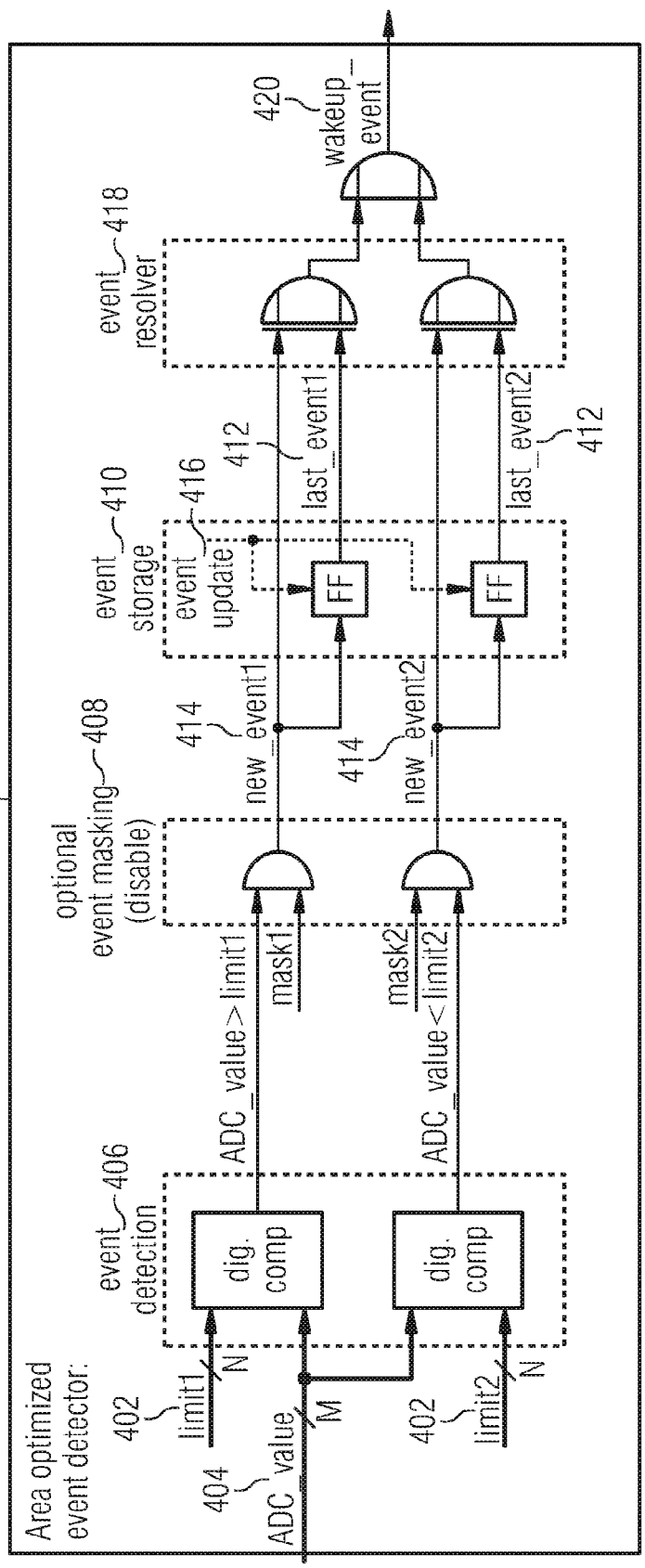
FIG. 19 shows an embodiment of an event detector circuit, which may be implemented in the wake-up circuit of FIG. 2.

FIG. 19 shows an embodiment of an event detector circuit 400, which may be implemented in the wake-up circuit 212 (see FIG. 2) based on fixed or variable limits 401. An ADC value 404 representative of the event may be compared with the given limits 402 by two digital comparators 406. The resulting comparison may be masked 408, which will disable it in the further detection process. An event storage 410 may contain the previous results 412 (e.g., last_event1 or last event_2), which may be done by delaying the actual comparison results 414 (indicated in the figure as new_event1 and new_event2) using storage elements like flip-flops controlled by a enable signal 416 with the given ADC update rate or any other rate which is appropriate for a certain application. The old events and new events may then be compared by a resolver 418 to generate a new wakeup event 420. For each ADC channel to be used as event source such a circuit 400 may be provided.

FIG. 20 illustrates an embodiment for an area optimized comparator circuit for fixed limit values, which may be used in the circuit 400 of FIG. 19. It is based on detection of levels which are two-power-N below the positive full scale range 422 or two-power-N above a negative full scale range 424 of a twos-complement binary ADC value. The actual embodiment uses a 5 bit ADC value M and a 3 bit comparison N providing a threshold 4 LSB below the upper full scale range (+15) and 4 LSB above the lower full scale range (−16), in other embodiments the numbers may vary, as long as the ADC bit width is larger than the comparison bit width (otherwise the comparison will practically always match, which is of no use anymore). The resulting logic 426 comprises only logic gates, no adder or subtraction circuits are required to determine the difference between the ADC value and the given limits.

FIGS. 21A-21F illustrate the behaviour of the circuit 400 of FIG. 19 using the circuit 426 of FIG. 20. FIGS. 21A-21F illustrate the point in time where the ADC value 404 (see FIGS. 21A and 21B) crosses a limit 428 generating a new event 1 signal 414 (see FIG. 21C). As the last event 1 signal 412 is still different to the new event 1 signal 414 (see FIGS. 21C and 21D), the wakeup event signal 420 is generated (see FIG. 21E). Following the update rate 235 (see FIG. 21F), the last event 1 signal 412 will become the new event signal at the next event 430, causing that these two signals are the same, thus the wakeup event will be disabled again. Of course, this wake up event signal may be further pulse shaped in another embodiment using the available clock sources if required.

Although the invention and its advantages have been described in detail, it should be understood that various changes, substitutions and alterations can be made herein without departing from the spirit and scope of the invention as defined by the appended claims.

Moreover, the scope of the present application is not limited to the particular embodiments of the process, machine, manufacturer, composition of matters, means, method and steps described in the specification. As one of ordinary skill in the art will readily appreciate from the disclosure of the present application, processes, machines, manufacture, compositions of matter, means, methods, or steps presently existing or later to be developed that perform substantially the same function or achieve substantially the same result as the corresponding embodiments described herein may be utilized according to the invention. Accordingly, the appended claims are intended to include within their scope such processes, machines, manufacture, compositions of matter, means, and methods of steps.

What is claimed is:

1. A system, comprising:
   a digital sensor system including:
      a sensor element;
      a wakeup circuit to provide a first wakeup signal to the sensor element based on a predefined event being detected,
         the first wakeup signal activating the sensor element for performing a sensing action;
      a digital interface to:
         provide a second wakeup signal based on the sensing action being performed by the sensor element and a result of the sensing action; and
   a microcontroller to:
      receive the second wakeup signal provided by the digital interface, and
      wake from a sleep mode based on receiving the second wakeup signal provided by the digital interface.

2. The system of claim 1, wherein the microcontroller is further to:
   determine information that describes a wakeup signal format;
   determine that a format of the second wakeup signal matches the wakeup signal format; and
   wherein the microcontroller, when waking from the sleep mode, is to:
      wake from the sleep mode based on determining that the format of the second wakeup signal matches the wakeup signal format.

3. The system of claim 1, wherein the second wakeup signal includes information associated with the predefined event or information associated with a sensor value.

4. The system of claim 1, wherein the digital sensor system acts as a master on a bus associated with the system.

5. The system of claim 1, wherein the microcontroller acts as a slave on a bus associated with the system.

6. The system of claim 1, wherein the digital sensor system and the microcontroller communicate using a short pulse width modulation code (SPC) protocol, a peripheral sensor interface 5 (PSI5) protocol, or a universal asynchronous receiver transmitter (UART) protocol.

7. The system of claim 1, wherein the microcontroller is further to:
   return to the sleep mode after processing a signal associated with the sensing action.

8. The system of claim 7, wherein the sensor element is a first sensor element and the digital interface is a first digital interface, and
   wherein the digital sensor system further comprises:
      a second sensor element; and
      a second digital interface to:
         provide another wakeup signal based on another sensing action being performed by the second sensor element after another predefined event is detected by the digital sensor system; and
   wherein the microcontroller is further to:
      receive the other wakeup signal provided by the second digital interface, and
      wake from the sleep mode based on receiving the other wakeup signal provided by the second digital interface.

9. The system of claim 1, wherein the second wakeup signal includes information that identifies the digital sensor system.

10. The system of claim 1, wherein the second wakeup signal includes a complex pulse.

11. A system, comprising:
    a sensor element to perform a sensing action based on a detection of a predefined event;
    a wakeup circuit to provide a first wakeup signal to the sensor element,
       the first wakeup signal activating the sensor element for performing the sensing action;
    a digital interface to provide a second wakeup signal based on the sensing action being performed by the sensor element and a result of the sensing action; and
    a microcontroller to:
       receive the second wakeup signal provided by the digital interface, and
       wake from a sleep mode based on receiving the second wakeup signal provided by the digital interface.

12. The system of claim 11, wherein the microcontroller is further to:
    determine information associated with a wakeup signal format;
    determine that a format of the second wakeup signal matches the wakeup signal format; and
    wherein the microcontroller, when waking from the sleep mode, is further to:
       wake from the sleep mode based on determining that the format of the second wakeup signal matches the wakeup signal format.

13. The system of claim 11, wherein the second wakeup signal includes information associated with the predefined event or information associated with a sensor value.

14. The system of claim 11, wherein a digital sensor, including the sensor element and the digital interface, acts as a master on a bus associated with the system, and wherein the microcontroller acts as a slave on the bus associated with the system.

15. The system of claim 11, wherein the digital interface and the microcontroller communicate in accordance with a short pulse width modulation code (SPC) protocol, a peripheral sensor interface 5 (PSI5) protocol, or a universal asynchronous receiver transmitter (UART) protocol.

16. The system of claim 11, wherein the microcontroller is further to:
    return to the sleep mode after processing a signal associated with the sensing action.

17. The system of claim 16, wherein the sensor element is a first sensor element and the digital interface is a first digital interface, and
    wherein the system further comprises:
       a second sensor element to perform another sensing action based on a detection of another predefined event; and
       a second digital interface to provide another wakeup signal based on the other sensing action being performed by the second sensor element; and
    wherein the microcontroller is further to:
       receive the other wakeup signal provided by the second digital interface, and
       wake from the sleep mode based on receiving the other wakeup signal provided by the digital interface.

18. The system of claim 11, wherein the second wakeup signal includes information that identifies a digital sensor system associated with the sensor element.

19. The system of claim 11, wherein the second wakeup signal includes a single pulse.

20. A digital sensor system, comprising:
- a sensor element to:
  - perform a sensing action based on a detection of a predefined event;
- a wakeup circuit to:
  - provide a first wakeup signal to the sensor element, the first wakeup signal activating the sensor element to perform the sensing action; and
- a digital interface to:
  - provide a second wakeup signal based on the sensing action being performed by the sensor element and a result of the sensing action,
  - wherein the second wakeup signal causes a microcontroller, associated with the digital sensor system, to wake from a sleep mode, and
  - wherein the second wakeup signal includes information associated with the predefined event.

* * * * *